US012773838B2

(12) United States Patent
Kim et al.

(10) Patent No.: US 12,773,838 B2
(45) Date of Patent: Oct. 27, 2026

(54) ADHESIVE SHEET AND SEMICONDUCTOR PACKAGE INCLUDING THE SAME

(71) Applicant: Samsung Electronics Co., Ltd., Suwon-si (KR)

(72) Inventors: Dongkwan Kim, Hwaseong-si (KR); Kunsil Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 803 days.

(21) Appl. No.: 17/844,453

(22) Filed: Jun. 20, 2022

(65) Prior Publication Data

US 2023/0005872 A1 Jan. 5, 2023

(30) Foreign Application Priority Data

Jul. 1, 2021 (KR) ........................ 10-2021-0086713

(51) Int. Cl.
*H01L 23/00* (2006.01)
*B32B 7/12* (2006.01)
(Continued)

(52) U.S. Cl.
CPC .................................... *B32B 7/12* (2013.01); *C09J 7/30* (2018.01); *H10W 74/117* (2026.01);
(Continued)

(58) Field of Classification Search
CPC ..... H01L 24/29; H01L 23/3128; H01L 24/32; H01L 25/18; H01L 24/73; H01L 2224/2929; H01L 2224/29386; H01L 2224/32145; H01L 2224/73204; H01L 24/13; H01L 25/03; H01L 25/0657; H01L 25/50; H01L 21/6835; H01L 24/16; H01L 24/83; H01L 2221/68345; H01L 2221/68381; H01L 2224/16145;
(Continued)

(56) References Cited

U.S. PATENT DOCUMENTS 8,610,293 B2 12/2013 Shiobara et al.
8,613,623 B2 12/2013 Sato
(Continued)

FOREIGN PATENT DOCUMENTS

EP 3037492 A1 6/2016
JP 2009197185 A 9/2009
(Continued)

OTHER PUBLICATIONS

David H. Olson et al., Local Thermal Conductivity Measurements to Determine the Fraction of α-Cristobalite in Thermally Grown Oxides for Aerospace Applications, 2020, p. 2 (Year: 2020).*
(Continued)

*Primary Examiner* — Marlon T Fletcher
*Assistant Examiner* — Samuel Jonathan Smith
(74) *Attorney, Agent, or Firm* — Wolf, Greenfield & Sacks, P.C.

(57) ABSTRACT

A semiconductor package includes: a first substrate; a second substrate including a semiconductor element formed thereon; a film layer between the first substrate and the second substrate; and a molding member surrounding the second substrate, wherein the film layer includes a crystalline spherical silica filler distributed in a matrix.

17 Claims, 16 Drawing Sheets

(51) Int. Cl.

| | |
|---|---|
| ***C08K 3/36*** | (2006.01) |
| ***C08K 7/18*** | (2006.01) |
| ***C09J 7/30*** | (2018.01) |
| ***H01L 23/31*** | (2006.01) |
| ***H01L 25/18*** | (2023.01) |
| ***H10W 74/10*** | (2026.01) |
| ***H10W 74/15*** | (2026.01) |
| ***H10W 90/00*** | (2026.01) |
| *H10W 72/30* | (2026.01) |

(52) U.S. Cl.

CPC ......... *H10W 90/00* (2026.01); *B32B 2457/14* (2013.01); *C08K 3/36* (2013.01); *C08K 7/18* (2013.01); *C08K 2201/001* (2013.01); *C08K 2201/005* (2013.01); *C08K 2201/006* (2013.01); *C09J 2203/326* (2013.01); *C09J 2301/408* (2020.08); *C09J 2301/412* (2020.08); *C09J 2400/10* (2013.01); *H10W 72/325* (2026.01); *H10W 72/353* (2026.01); *H10W 72/354* (2026.01); *H10W 74/15* (2026.01); *H10W 90/732* (2026.01)

(58) Field of Classification Search

CPC . H01L 2224/16225; H01L 2224/32225; H01L 2224/73253; H01L 2224/83101; H01L 2225/06513; H01L 2225/06541; H01L 2225/06589; H01L 2924/15174; H01L 2924/15192; H01L 2924/15311; H01L 2924/16152; H01L 2924/181; H01L 2924/18161; H01L 24/97; H01L 24/26; H01L 23/36; H01L 23/49572; H01L 2224/29025; H01L 2224/29026; B32B 7/12; B32B 2457/14; B32B 27/20; C09J 7/30; C09J 2203/326; C09J 2301/408; C09J 2301/412; C09J 2400/10; C09J 2301/312; C09J 7/10; C09J 163/00; C09J 11/04; C09J 201/00; C08K 3/36; C08K 7/18; C08K 2201/001; C08K 2201/005; C08K 2201/006; C08K 2201/016; H10W 90/732; H10W 90/288; H10W 90/297; H10W 74/10; H10W 74/15; H10W 90/734; H10W 90/722

See application file for complete search history.

(56) References Cited

U.S. PATENT DOCUMENTS

| | | | | |
|---|---|---|---|---|
| 9,212,253 | B2 | 12/2015 | Lee et al. | |
| 9,589,945 | B2 | 3/2017 | Jo et al. | |
| 10,083,939 | B2 | 9/2018 | Seo et al. | |
| 2004/0080055 | A1 | 4/2004 | Jiang | |
| 2015/0016072 | A1* | 1/2015 | Iwayama | H01L 21/563 430/319 |
| 2015/0270209 | A1* | 9/2015 | Woychik | H01L 25/0657 257/774 |
| 2015/0284608 | A1* | 10/2015 | Hofstetter | C08K 3/36 252/182.14 |
| 2018/0044560 | A1 | 2/2018 | Lyon et al. | |
| 2018/0079939 | A1 | 3/2018 | Kubota et al. | |
| 2018/0105671 | A1* | 4/2018 | Bork | C08K 5/13 |
| 2019/0077133 | A1* | 3/2019 | Sawaguchi | B32B 27/304 |
| 2020/0148544 | A1* | 5/2020 | Sato | C01B 33/12 |
| 2020/0211920 | A1* | 7/2020 | Lee | H01L 23/5385 |

FOREIGN PATENT DOCUMENTS

| | | | | | |
|---|---|---|---|---|---|
| JP | 2012224679 | A | | 11/2012 | |
| JP | 2012238703 | A | * | 12/2012 | |
| JP | 2013112710 | A | | 6/2013 | |
| JP | 5293496 | B2 | * | 9/2013 | H01L 24/29 |
| KR | 20160037582 | A | | 4/2016 | |
| KR | 20170129534 | A | | 11/2017 | |
| KR | 101902137 | B1 | | 9/2018 | |
| KR | 20200085784 | A | | 7/2020 | |

OTHER PUBLICATIONS

R.M. Waxler and G.W. Cleek, Refractive Indices of Fused Silica at Low Temperatures, Apr. 7, 1971, p. 2 (Year: 1971).*

* cited by examiner

ADHESIVE SHEET AND SEMICONDUCTOR PACKAGE INCLUDING THE SAME

CROSS-REFERENCE TO RELATED APPLICATION

This application is based on and claims priority under 35 U.S.C. § 119 to Korean Patent Application No. 10-2021-0086713, filed on Jul. 1, 2021 in the Korean Intellectual Property Office, the disclosure of which is incorporated by reference herein in its entirety.

BACKGROUND

The inventive concept relates to an adhesive sheet and a semiconductor package including the same, and more particularly, to an adhesive sheet which is capable of performing accurate alignment when a plurality of semiconductor devices are stacked and effective dissipation of heat generated during an operation, and a semiconductor package including the adhesive sheet.

Technologies for stacking a plurality of semiconductor devices have been developed and applied for manufacturing electronic products in which semiconductor devices are highly integrated. The stacked semiconductor devices may generate a lot of heat during an operation, and accordingly, a method of promptly dissipating the heat is required. Furthermore, manufacturing the electronic products with a high reliability while maintaining good heat dissipation performance is required.

SUMMARY

The inventive concept provides a semiconductor package in which a plurality of semiconductor devices are accurately arranged and stacked and effectively dissipate heat generated during an operation.

The inventive concept also provides an adhesive sheet, which has a good heat conductivity and a high transmittance in a visible light range, and accurately aligns a plurality of semiconductor devices when stacking them.

According to an aspect of the inventive concept, there is provided a semiconductor package including: a first substrate; a second substrate including a semiconductor element formed thereon; a film layer between the first substrate and the second substrate; and a molding member surrounding the second substrate, wherein the film layer includes a crystalline spherical silica filler distributed in a matrix.

According to another aspect of the inventive concept, there is provided a semiconductor package including: a package substrate; an interposer substrate on the package substrate; a first semiconductor device attached to or on the interposer substrate and including a plurality of stacked semiconductor chips; a second semiconductor device adjacent the first semiconductor device and attached to or on the interposer substrate, and a molding member surrounding at least side surfaces of the plurality of stacked semiconductor chips, wherein the first semiconductor device further includes an adhesive film layer between adjacent ones of the plurality of stacked semiconductor chips, wherein the adhesive film layer includes a matrix and a crystalline silica fillers dispersed in the matrix, and a content of the crystalline silica filler is about 30 weight % to about 90 weight % with respect to a weight of the adhesive film layer.

According to another aspect of the inventive concept, there is provided an adhesive sheet including: a polymer matrix; and a crystalline silica filler dispersed in the polymer matrix, wherein the polymer matrix includes at least one of epoxy-based polymer, acryl-based polymer, bismaleimide-based polymer, and phenoxy-based polymer, wherein the crystalline silica filler has a thermal conductivity of about 5 W/(m·K) to about 30 W/(m·K), a refractive index of about 1.65 or less, and a sphericity of about 0.8 or more, and a content of the crystalline silica filler is about 30 weight % to about 90 weight % with respect to a weight of the adhesive sheet.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
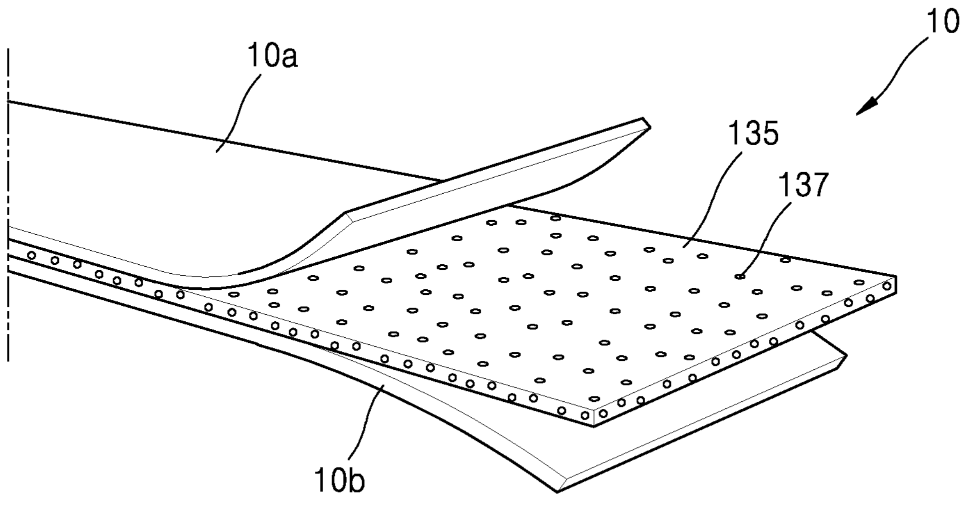
FIG. 1 is a schematic diagram of an adhesive sheet of a stand-alone type, according to an embodiment.

Hereinafter, embodiments of the inventive concept are described in detail in conjunction with the accompanying drawings. Throughout the specification, the same reference numerals are used to indicate the same components.

FIG. 1 is a schematic diagram of an adhesive sheet 10 of a stand-alone type, according to an embodiment.

Referring to FIG. 1, the adhesive sheet 10 of a stand-alone type may include a polymer matrix 135 and a silica filler 137 distributed in the polymer matrix 135. In some embodiments, a first cover film **10*a* may be provided on one surface of the polymer matrix 135, and a second cover film 10*b* may be provided on the other (opposite) surface of the polymer matrix 135. The first cover film 10*a* and the second cover film 10*b* may be provided on two main or primary surfaces of the polymer matrix 135**, respectively.

The first cover film **10*a* and the second cover film 10*b*** may be any generally known polymer film as long as peelable, and may also be a release film.

Non-limiting examples of a film usable as the first cover film **10*a* and the second cover film 10*b*** may include a polyester film such as polyethylene terephthalate (PET), polybutylene terephthalate, and polyethylene naphthalate, a polyethylene film, a polypropylene film, cellophane, a diacetyl cellulose film, a triacetyl cellulose film, an acetyl cellulosebutyrate film, a polyvinylchloride film, a polyvinylidene chloride film, a polyvinyl alcohol film, an ethylene-vinyl acetate copolymer film, a polystyrene film, a polycarbonate film, a polymethylpentene film, a polysulfone film, a polyetheretherketone film, a polyethersulfone film, a polyetherimide film, a polyimide film, a fluorine resin film, a polyamide film, an acryl resin film, a norbornene resin film, a cycloolefin resin film, etc.

The first cover film **10*a* and the second cover film 10*b* may be transparent or translucent, or colored or uncolored. In some embodiments, the first cover film 10*a* and the second cover film 10***b* may include PET. In some embodiments, the first cover film 10*a* and the second cover film 10*b* may include polyimide.

Thicknesses of the first cover film 10*a* and the second cover film 10*b* may be about 25 μm to about 150 μm, about 30 μm to about 100 μm, or about 30 μm to about 80 μm.

The adhesive sheet 10 may be used as a film, which adheres and combines semiconductor devices stacked to each other, when the semiconductor device is packaged. In addition, the adhesive sheet 10 may reduce deformation by redistributing stress due to a difference of thermal expansion coefficients between the semiconductor devices adhered to each other.

Polymer Matrix

The polymer matrix 135 may include at least one of, for example, epoxy-based polymer, acryl-based polymer, bismaleimide-based polymer, and phenoxy-based polymer.

The epoxy-based polymer may include, for example, a bisphenol A-type epoxy resin, a bisphenol F-type epoxy resin, a naphthalene-type epoxy resin, an aminophenol-type epoxy resin, a water-added bisphenol-type epoxy resin, an alicyclic epoxy resin, an alcohol ether-type epoxy resin, an annular aliphatic-type epoxy resin, a fluorene-type epoxy resin, a siloxane-based epoxy resin, or the like, but is not limited thereto. These materials may be used alone or in a mixture of two or more.

The acryl-based polymer may include acryl-based polymer obtained by radical polymerization with acryl-based monomer as a raw material.

In some embodiments, the acryl-based monomer may include, for example, methyl(meth)acrylate, ethyl(meth) acrylate, propyl(meth)acrylate, isopropyl(meth)acrylate, butyl(meth)acrylate, isobutyl(meth)acrylate, hexyl(meth) acrylate, 2-ethylhexyl(meth)acrylate, n-octyl(meth)acrylate, isooctyl(meth)acrylate, n-nonyl(meth)acrylate, isononyl (meth)acrylate, n-decyl(meth)acrylate, isodecyl(meth)acrylate, n-dodecyl(meth)acrylate, n-tridecyl(meth)acrylate, n-tetradecyl(meth)acrylate, 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth) acrylate, 10-hydroxydesil(meth)acrylate, 12-hydroxylauryl (meth)acrylate, (4-hydroxymethylcyclohexyl) methylacrylate, N-methylol(meth)acrylamide, ethyleneglycol di(meth)acrylate, diethyleneglycol di(meth)acrylate, tetraethyleneglycol di(meth)acrylate, neopentylglycol di(meth)acrylate, 1,6-hexandiol di(meth)acrylate, trimethylolpropane tri(meth)acrylate, pentaerythritol tri (meth)acrylate, dipentaerythritol hexa(meth)acrylate, divinylbenzene, N,N'-methylene bisacrylamide, or the like, but is not limited thereto.

The bismaleimide-based polymer may include polymer obtained by polymerization of maleimide monomers including one or more maleimide radicals.

The maleimide monomer may include, for example, N-phenylmaleimide, N-(2-methylphenyl)maleimide, N-(4-methylphenyl)maleimide, N-(2,6-dimethylphenyl)maleimide, bis(4-maleimidophenyl)maleimide, 2,2-bis(4-(4-maleimidophenoxy)-phenyl)propane, bis(3,5-dimethyl-4-maleimidophenyl)methane, bis(3-ethyl)-5-methyl-4-maleimidophenyl)methane, bis(3,5-diethyl-4-maleimidophenyl)methane, polyphenylmethane bismaleimide, maleimide having other biphenyl structure, but the inventive concept is not limited thereto.

In addition, the bismaleimide-based polymer may also be obtained from a prepolymer including maleimide radical, and the prepolymer may include any one of or a mixture of at least two of, for example, N-phenylmaleimide prepolymer, N-(2-methylphenyl)maleimide prepolymer, N-(4-methylphenyl)maleimide prepolymer, N-(2,6-methylphenyl)maleimide prepolymer, bis(4-maleimidophenyl) methane prepolymer, 2,2-bis(4-(4-maleimidophenoxy)-phenyl)propane prepolymer, bis(3,5-dimethyl-4-maleimidophenyl)methane prepolymer, bis(3-ethyl-5-methyl-4-maleimidophenyl)methane prepolymer, bis(3,5-diethyl-4-maleimidophenyl)methane prepolymer, polyphenylmethanebismaleimide prepolymer, maleimide prepolymer having a non-phenyl structure, prepolymer including N-phenylmaleimide and amine-based compound, prepolymer including n-(4-methylphenyl)maleimide and amine-based compound, prepolymer including N-(2,6-dimethylphenyl)maleimide and amine-based compound, prepolymer including bis(4-maleimidophenyl)methane and amine-based compound, prepolymer including 2,2-bis(4-(4-maleimidophenoxy)-phenyl)propane and amine-based compound, prepolymer including bis(3,5-dimethyl-4-maleimidophenyl)methane and amine-based compound, prepolymer including bis(3-ethyl-5-methyl-4-maleimidophenyl)methane and amine-based compound, prepolymer including bis (3,5-diethyl-methyl-4-maleimidophenyl)methane and amine-based compound, prepolymer including maleimide including a non-phenyl structure and amine-based compound, or prepolymer including polyphenylmethane bismaleimide and amine-based compound, but is not limited thereto.

The phenoxy-based polymer may include polymer obtained by polymerizing monomers such as phenoxyethyl acrylate, phenoxydiethyleneglycol acrylate, phenoxy polyethyleneglycol acrylate, nonylphenoxy polyethyleneglycol acrylate, nonylphenoxy polypropyleneglycol acrylate, nonylphenoxyethyleneglycol acrylate, and 2-hydroxy-3-phenoxypropyl(meth)acrylate. In some embodiments, the phenoxy-based polymer may include poly(2,6-dilauryl-1,4-phenylene)ether, poly(2,6-diphenyl-1,4-phenylene)ether, poly(2-methyl-6-phenyl-1,4-phenylene)ether, poly(2,6-dibenzyl-1,4-phenylene)ether, poly(2,6-dimethyl-1,4-phenylene)ether, poly(2,6-diethyl-1,4-phenylene)ether, poly(2-methyl-6-ethyl-1,4-phenylene)ether, poly(2,6-dipropyl-1,4-phenylene)ether, poly(2-ethyl-6-propyl-1,4-phenylene) ether, poly(2-methyl-1,4-phenylene)ether, poly(3-methyl-1,4-phenylene)ether, poly(2-methyl-6-allyl-1,4-phenylene) ether, poly(2,3,6-trimethyl-1,4-phenylene)ether, poly(2,3,5,6-tetramethyl-1,4-phenylene)ether, poly(2,5-dimethyl-1,4-phenylene)ether, or the like, but is not limited thereto.

Cross-Linking Agent and Rate Controlling Agent

The adhesive sheet 10 may further include a cross-linking agent dispersed in the polymer matrix 135.

The cross-linking agent may include an anhydride-based cross-linking agent such as tetrahydrophthalic anhydride, methyltetrahydrophthalic anhydride, methylhexahydrophthalic anhydride, hexahydrophthalic anhydride, thrylalkyltetrahydrophthalic anhydride, methylcyclohexenedicarbocylic anhydride, phthalic anhydride, maleic acid anhydride, and pyromelitic anhydride; an aromatic amine cross-linking agent such as methphenylene diamine, diaminoiphenylmethane, and diaminoiphenylsulfone; an aliphatic amine cross-linking agent such as diethylene triamine, and triethylene tetraamine; a phenolic cross-linking agent such as phenolaralkyl-type phenol resin, phenol novolac-type phenol resin, xylok-type phenol resin, cresol novolac-type phenol resin, naphthol-type phenol resin, terpene-type phenol resin, multifunctional phenol resin, dicyclopentadiene-based phenol resin, naphthalene-type phenol resin, and novolac-type phenolic resin synthesized from bisphenol A and resol; a latent cross-linking agent such as dicyandiamide; or the like, but is not limited thereto. These cross-linking agents may be used alone or in a mixture of two or more.

With respect to 100 parts by weight of the adhesive sheet 10, the content of the cross-linking agent may be about 10 parts by weight to about 40 parts by weight. When the content of the cross-linking agent is excessively small or excessively large, it may be difficult to control a curing rate.

The adhesive sheet 10 may further include a rate controlling agent.

The rate controlling agent may include, for example, 1-methylimidazole, 2-methylimidazole, dimethylbenzylimidazole, 1-decyl-2-methylimidazole, benzyldimethylamine, trimethylamine, triethylamine, diethylaminopropyl amine, pyridine, 1,8-diazabicyclo[5.4.0]undec-7-ene, 2-heptadecylimidazol, borontrifluoride monoethyl amine, 1-[3(2-hydroxyphenyl)prop-2-enyl]imidazole, etc. However, the inventive concept is not limited thereto.

With respect to 100 parts by weight of the adhesive sheet 10, the content of the rate controlling agent may be about 1 part by weight to about 5 parts by weight. When the content of the rate controlling agent is excessively small or excessively large, it may be difficult to control a curing rate.

Silica Filler

The silica filler 137, which is crystalline, may be distributed in the polymer matrix 135.

The silica filler 137 may include silica that is not non-crystalline, and may be polycrystalline or monocrystalline. In some embodiments, the silica filler 137 may include single crystal silica.

With respect to a weight of the adhesive sheet 10, the content of the silica filler 137 may be about 1% by weight to about 90% by weight. In some embodiments, the content of the silica filler 137 may be about 1% to about 90% by weight, about 5% to about 88% by weight, about 10% to about 85% by weight, about 15% to about 83% by weight, about 20% to about 80% by weight, about 23% to about 78% by weight, about 25% to about 75% by weight, about 28% to about 73% by weight, about 30% to about 70% by weight, or any range therebetween.

When the content of the silica filler 137 is excessively low, a rate of dissipating heat may be reduced when the adhesive sheet 10 is attached to a semiconductor device. When the content of the silica filler 137 is excessively high, it may be difficult to manufacture the silica filler 137 in a sheet form.

The silica filler 137 may have an average dimension of about 1 μm to about 100 μm. Each particle of the silica filler 137 may have an irregular form, and in this case, a dimension thereof may be represented by the longest dimension of each of the silica fillers 137. In other words, an average of the longest dimensions of the silica fillers 137 in the adhesive sheet 10 may be about 1 μm to about 100, μm about 5 μm to about 98 μm, about 10 μm to about 95 μm, about 15 μm to about 93 μm, about 20 μm to about 90 μm, about 25 μm to about 88 μm, about 30 μm to about 85 μm, about 35 μm to about 83 μm, about 40 μm to about 80 μm, about 50 μm to about 75 μm, or any range therebetween.

When an average dimension of the silica filler 137 is excessively small, the thermal conductivity may be reduced, and in addition, filling a large amount of the silica filler 137 may be difficult. On the other hand, when the average dimension of the silica filler 137 is excessively large, there may be a limit in manufacturing the adhesive sheet 10 to be thin.

In some embodiments, a percentage of a weight of the silica filler 137 having a dimension of 100 μm or less over the total weight of the silica filler 137 in the adhesive sheet 10 may be about 90% or more. In some embodiments, a percentage of the weight of the silica filler 137 having a dimension of 100 μm or more over the total weight of the silica filler 137 in the adhesive sheet 10 may be about 10% or less.

The silica filler 137 may have a refractive index of about 1.65 or less. In some embodiments, the silica filler 137 may have a refractive index of about 1.35 to about 1.65, about 1.36 to about 1.63, about 1.37 to about 1.61, about 1.38 to about 1.59, about 1.39 to about 1.57, about 1.40 to about 1.55, about 1.41 to about 1.53, about 1.42 to about 1.51, about 1.43 to about 1.49, or any range therebetween.

When the refractive index of the silica filler 137 is excessively small, light transmittance may be good, but it may be difficult to manufacture the silica filler 137. When the refractive index of the silica filler 137 is excessively large, light transmittance of the adhesive sheet 10 may be excessively low.

The silica filler 137 may have a thermal conductivity of about 5 W/(m·K) to about 30 W/(m·K). In some embodiments, the silica filler 137 may have a thermal conductivity of about 5 W/(m·K) to about 30 W/(m·K), about 5.5 W/(m·K) to about 28 W/(m·K), about 6 W/(m·K) to about 26 W/(m·K), about 6.5 W/(m·K) to about 24 W/(m·K), about 7 W/(m·K) to about 22 W/(m·K), about 7.5 W/(m·K) to about 20 W/(m·K), about 8 W/(m·K) to about 18 W/(m·K), about 8.5 W/(m·K) to about 16 W/(m·K), about 9 W/(m·K) to about 14 W/(m·K), or any range therebetween.

When the thermal conductivity of the silica filler 137 is excessively low, a rate of dissipating heat may be reduced when the adhesive sheet 10 is attached to a semiconductor device. When the refractive index of the silica filler 137 is excessively high, the thermal conductivity speed may be good when the adhesive sheet 10 is attached to a semiconductor device, but it may be difficult to manufacture the silica filler 137.

The silica filler 137 may have a sphericity of about 0.8 or more. The maximum possible value of the sphericity may be about 1, and when the maximum possible value is close to about 1, it may be evaluated that the shape is close to a sphere.

The sphericity may be defined as a ratio (B/A) of a surface area (B) of a sphere having the same volume as the silica filler 137 over a surface area (A) of the silica filler 137. When the surface area of the silica filler 137 is Ap and a volume thereof is Vp, the sphericity thereof may be defined by Formula 1 below.

$$\Psi = \frac{\sqrt[3]{\pi(6V_p)^2}}{A_p}$$

In some embodiments, the silica filler 137 may have a sphericity of about 0.80 or more, about 0.81 or more, about 0.82 or more, about 0.83 or more, about 0.84 or more, about 0.85 or more, about 0.86 or more, about 0.87 or more, about 0.88 or more, about 0.89 or more, about 0.90 or more, about 0.91 or more, about 0.92 or more, about 0.93 or more, about 0.94 or more, about 0.95 or more, about 0.96 or more, or about 0.97 or more. The sphericity may be an average sphericity of the silica filler 137.

When the sphericity of the silica filler 137 is excessively small, the workability thereof may be reduced when the adhesive sheet 10 is manufactured.

In some embodiments, the silica filler 137 may include coesite and/or cristobalite. In some embodiments, the silica filler 137 may include cristobalite.

The adhesive sheet 10 may have a thickness of about 3 μm to about 50 μm. In some embodiments, the adhesive sheet 10 may have a thickness of about 4 μm to about 48 μm, about 5 μm to about 45 μm, about 6 μm to about 43 μm, about 8 μm to about 40 μm, about 10 μm to about 38 μm, about 12 μm to about 36 μm, about 15 μm to about 35 μm, about 5 μm to about 40 μm, or any range therebetween.

When the thickness of the adhesive sheet 10 is excessively small, a mechanical strength thereof may be insufficient. On the other hand, when the thickness of the adhesive sheet 10 is excessively large, it may be difficult to manufacture an electronic device, to which the adhesive sheet 10 is applied, to be thin.

The adhesive sheet 10 may have a viscosity of about 1500 Pa·s to about 20000 Pa·s at a temperature of about 25° C. In some embodiments, the adhesive sheet 10 may be configured to have a decreasing viscosity due to an increasing temperature, and be cured by irradiation of light such as infrared light.

In some embodiments, the adhesive sheet 10 may, at a temperature of about 25° C., have a viscosity of about 1500 Pa·s to about 20000 Pa·s, about 1800 Pa·s to about 17000 Pa·s, about 2000 Pa·s to about 15000 Pa·s, about 2300 Pa·s to about 14000 Pa·s, about 2500 Pa·s to about 13000 Pa·s, about 2700 Pa·s to about 12000 Pa·s, about 3000 Pa·s to about 11000 Pa·s, about 3500 Pa·s to about 10000 Pa·s, or any range therebetween.

When the viscosity of the adhesive sheet 10 is excessively low, it may be difficult that the adhesive sheet 10 stays in or of a stand-alone state or type. When the viscosity of the adhesive sheet 10 is excessively high, it may be difficult for the adhesive sheet 10 to be used for manufacturing a semiconductor device.

The adhesive sheet 10 may have transmittance of about 30% or more with respect to light having a wavelength in a range of about 400 nm to about 700 nm. Transmittance of the adhesive sheet 10 may be 100% or less.

In some embodiments, the adhesive sheet 10 may, with respect to light having a wavelength in a range of about 400 nm to about 700 nm, have transmittance of about 35% or more, about 40% or more, about 45% or more, about 50% or more, about 55% or more, about 60% or more, about 65% or more, about 70% or more, about 75% or more, about 80% or more, about 85% or more, about 90% or more, or about 95% or more.

When light transmittance of the adhesive sheet 10 is excessively low, because an alignment mark is not recognized when the adhesive sheet 10 is attached to a semiconductor device, it may be difficult to manufacture a semiconductor device.

Because the adhesive sheet 10 further includes the polymer matrix 135 in addition to the silica filler 137, the thermal conductivity of the adhesive sheet 10 may be different from that of the silica filler 137. The overall thermal conductivity of the adhesive sheet 10 may be about 1 W/(m·K) to about 5 W/(m·K). In some embodiments, the adhesive sheet 10 may have an overall thermal conductivity of about 1.2 W/(m·K) to about 4.8 W/(m·K), about 1.4 W/(m·K) to about 4.6 W/(m·K), about 1.6 W/(m·K) to about 4.4 W/(m·K), about 1.8 W/(m·K) to about 4.2 W/(m·K), about 2.0 W/(m·K) to about 4.0 W/(m·K), about 2.2 W/(m·K) to about 3.8 W/(m·K), about 2.4 W/(m·K) to about 3.6 W/(m·K), about 2.5 W/(m·K) to about 3.5 W/(m·K), or any range therebetween.

When the thermal conductivity of the adhesive sheet 10 is excessively low, a rate of dissipating heat may be reduced when the adhesive sheet 10 is attached to a semiconductor device. When the thermal conductivity of the adhesive sheet 10 is excessively high, a thermal dissipation speed may be good when the adhesive sheet 10 is attached to a semiconductor device, but it may be difficult to manufacture the adhesive sheet 10.

Figure 2:
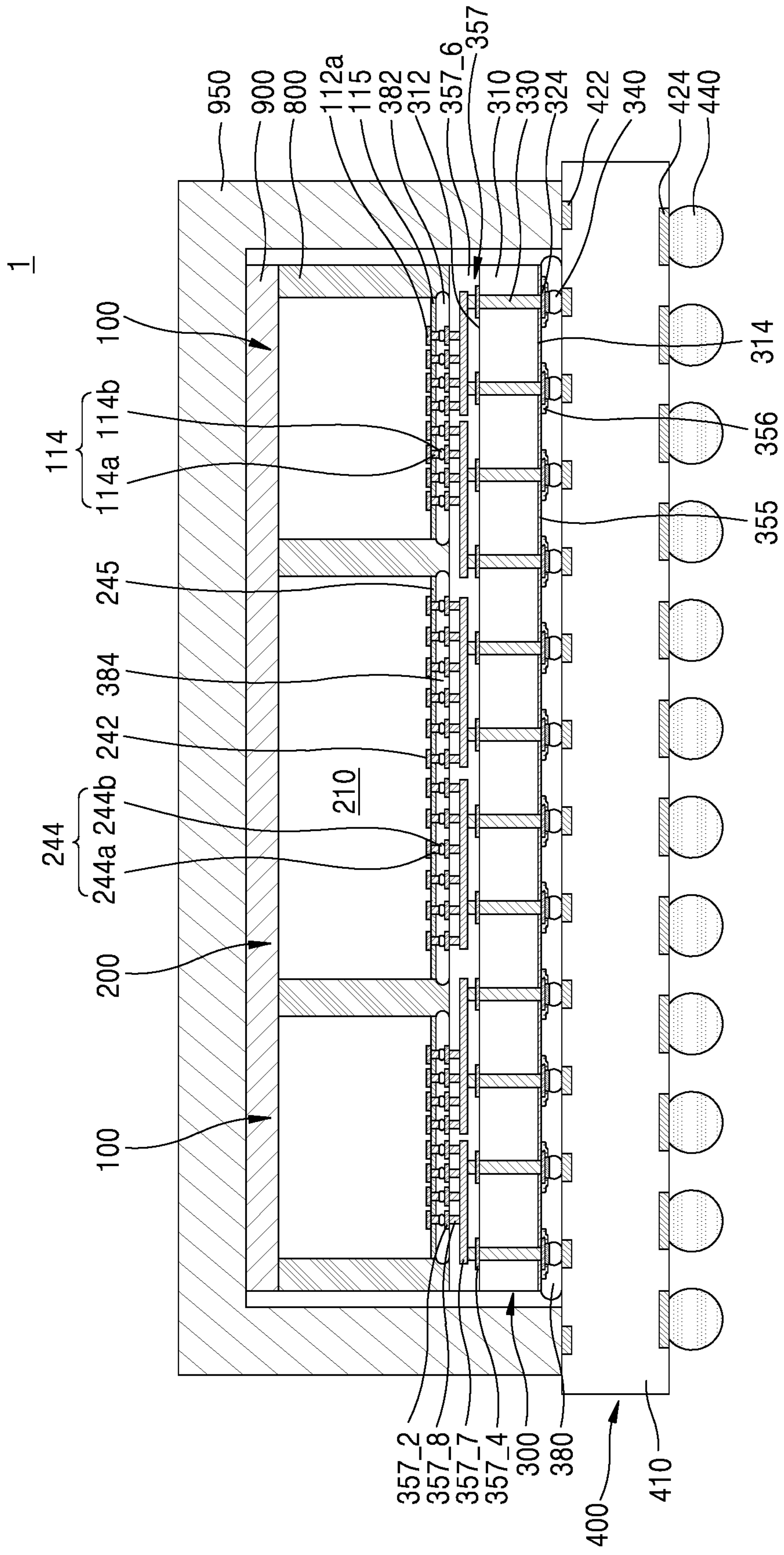
FIG. 2 is a cross-sectional view of a semiconductor package, according to an embodiment.
Figure 3:
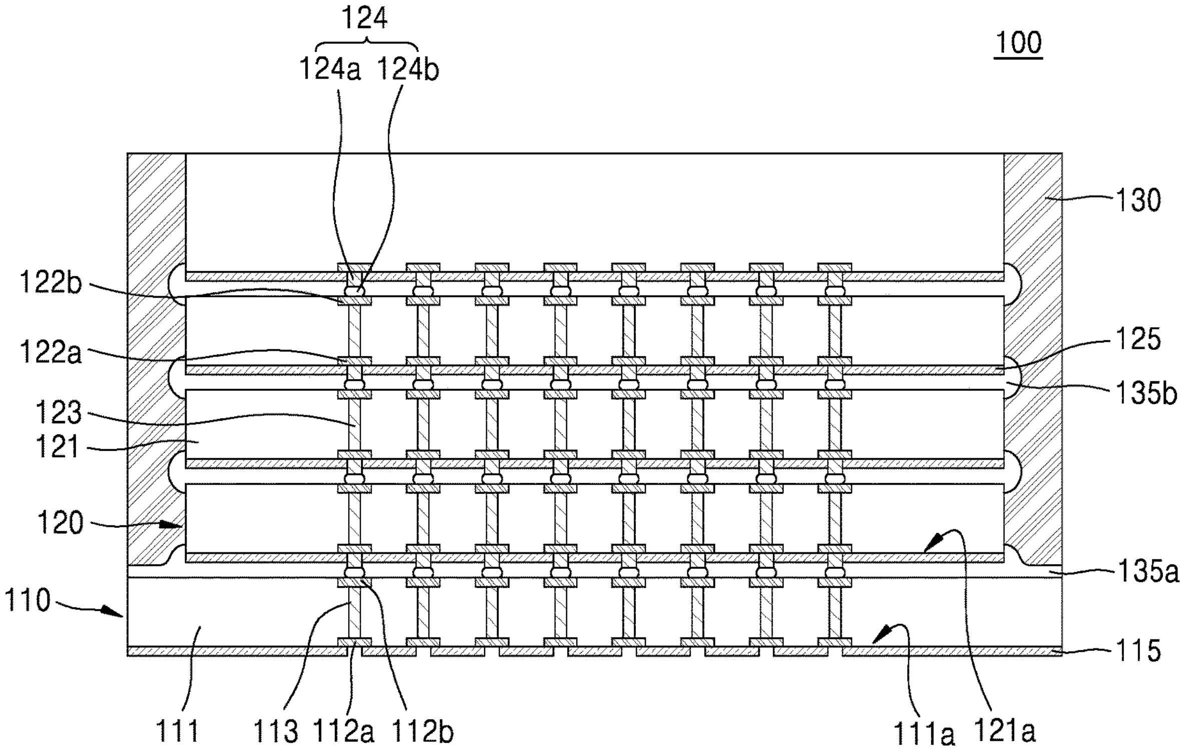
FIG. 3 is a cross-sectional view of a first semiconductor device included in a semiconductor package, according to an embodiment.

FIG. 2 is a cross-sectional view of a semiconductor package 1, according to an embodiment. FIG. 3 is a cross-sectional view of a first semiconductor device 100 included in the semiconductor package 1, according to an embodiment.

Referring to FIGS. 2 and 3, the semiconductor package 1 may include a second substrate 400 on which a first substrate 300 is mounted, the first semiconductor device 100 and a second semiconductor device 200, which are mounted on the first substrate 300. The first semiconductor device 100 and the second semiconductor device 200 may be mounted adjacent to each other in a horizontal direction on a redistribution structure 357 of the first substrate 300. In this case, the first semiconductor device 100 and the second semiconductor device 200 may be apart from each other in a lateral direction.

The first semiconductor device 100 and the second semiconductor device 200 may be electrically connected to the first substrate 300 via a plurality of first connection terminals 114 and a plurality of second connection terminals 244, respectively. The first semiconductor device 100 may include a plurality of first upper surface connection pads **112*a*, and the second semiconductor device 200 may include a plurality of second upper surface connection pads 242. The first substrate 300 may include a plurality of first redistribution pads 357_2. The plurality of first connection terminals 114 may be arranged between the plurality of first upper surface connection pads 112*a* and some of the plurality of first redistribution pads 357_2. The plurality of second connection terminals 244 may be arranged between the plurality of second upper surface connection pads 242 and the rest of the plurality of first redistribution pads 357_2**.

Each of the plurality of first connection terminals 114 may include a first conductive pillar **114*a* on the first upper surface connection pad 112*a* and a first conductive cap 114*b* on the first conductive pillar 114*a*. Each of the plurality of second connection terminals 244 may include a second conductive pillar 244*a* on the second upper surface connection pad 242 and a second conductive cap 244*b* on the second conductive pillar 244*a***.

The first semiconductor device 100 may include a first semiconductor chip 110 and a plurality of second semiconductor chips 120. In FIG. 3, the first semiconductor device 100 is illustrated as including four second semiconductor chips 120, but is not limited thereto. For example, the first semiconductor device 100 may include two or more second semiconductor chips 120. In some embodiments, the first semiconductor device 100 may include a multiple of four second semiconductor chips 120. The plurality of second semiconductor chips 120 may be sequentially stacked on the first semiconductor chip 110 in a vertical direction. Each of the first semiconductor chip 110 and the plurality of second semiconductor chips 120 may be sequentially stacked so that an active side of each of the first semiconductor chip 110 and the plurality of second semiconductor chips 120 faces downward (that is, toward the first substrate 300).

The first semiconductor chip 110 may include a first semiconductor substrate 111 having a first semiconductor element **111*a* formed on an active side thereof, the first upper surface connection pad 112***a* and a first lower surface connection pad 112*b* respectively arranged on the active surface and an inactive surface of the first semiconductor substrate 111, a first through electrode 113 penetrating at least a portion of the first semiconductor substrate 111 and electrically connecting the first upper surface connection pad 112*a* to the first lower surface connection pad 112*b*, and a first protective insulating layer 115 exposing at least a portion of the first upper surface connection pad 112*a* and covering the active surface of the first semiconductor substrate 111.

The first semiconductor substrate 111 may include, for example, a semiconductor material such as silicon (Si). Alternatively, the first semiconductor substrate 111 may include a semiconductor element such as germanium (Ge), or a compound semiconductor such as silicon carbide (SiC), gallium arsenide (GaAs), indium arsenide (InAs), and indium phosphide (InP). The first semiconductor substrate 111 may include a conductive region, for example, a well doped with impurities. The first semiconductor substrate 111 may have various element isolation structures such as a shallow trench isolation (STI) structure.

In the inventive concept, an upper surface and a lower surface of a semiconductor substrate such as the first semiconductor substrate 111 may be referred to as an active surface side and an inactive surface side of the semiconductor substrate, respectively. In other words, even when the active surface of the semiconductor substrate is below the inactive surface in a final product, in the inventive concept, the active surface side of the semiconductor substrate may be referred to as the upper surface of the semiconductor substrate, and the inactive surface side of the semiconductor substrate may be referred to as the lower surface of the semiconductor substrate. In addition, the terms 'an upper surface' and 'a lower surface' may be used for components arranged on the active surface and for components arranged on the inactive surface of the semiconductor substrate, respectively.

The first semiconductor element 111*a* may include various microelectronic elements, for example, a metal-oxide-semiconductor field effect transistor (MOSFET) such as a complementary metal-insulator-semiconductor or complementary metal-oxide-semiconductor (CMOS) transistor, an image sensor such as a system large scale integration (LSI) and a CMOS imaging sensor (CIS), a micro-electro-mechanical system (MEMS), an active device, a passive device, etc. The first semiconductor element 111*a* may be electrically connected to a conductive region of the first semiconductor substrate 111. In addition, the first semiconductor element 111*a* may be electrically separated from another first semiconductor element 111*a* adjacent thereto by an insulating layer.

In some embodiments, the first semiconductor chip 110 may include, for example, a dynamic random-access memory (RAM) (DRAM) chip, a static RAM (SRAM) chip, a flash memory chip, an electrically erasable and programmable RAM (EEPROM) chip, a phase-change RAM (PRAM) chip, a magnetic RAM (MRAM) chip, or a resistive RAM (RRAM) chip. In some embodiments, the first semiconductor chip 110 may include, for example, a central processing unit (CPU) chip, a graphics processing unit (GPU) chip, or an application processor (AP) chip.

In some embodiments, the first semiconductor chip 110 may include a high bandwidth memory (HBM) DRAM semiconductor chip. In some embodiments, the first semiconductor chip 110 may include a buffer chip including a serial-parallel conversion circuit. In some embodiments, the first semiconductor chip 110 may include a buffer chip for controlling the HBM DRAM semiconductor chip. When the first semiconductor chip 110 includes a buffer chip for controlling the HBM DRAM semiconductor chip, the first semiconductor chip 110 may be referred to as a master chip, and the HBM DRAM semiconductor chip may be referred to as a slave chip.

In FIG. 3, the first upper surface connection pad 112*a* is illustrated as being buried in the first semiconductor substrate 111, but is not limited thereto. In some embodiments, the first upper surface connection pad 112*a* may protrude from a surface of the first semiconductor substrate 111.

In the inventive concept, the first semiconductor substrate 111 may include a base substrate including a semiconductor material, various conductive material layers formed on the base substrate and constituting the first semiconductor element 111*a*, an insulating material layer, a wiring pattern electrically connected to the first semiconductor element 111*a*, and a wiring via. In other words, the first semiconductor substrate 111 may mean only that a main material thereof includes a semiconductor material, and does not mean that the first semiconductor substrate 111 includes only the semiconductor material.

The second semiconductor chips 120 may include a second semiconductor substrate 121 including a second semiconductor element 121*a* formed on an active surface thereof, an inner upper surface connection pad 122*a* and an inner lower surface connection pad 122*b* respectively arranged on an active surface and an inactive surface of the second semiconductor substrate 121, a second through electrode 123 penetrating at least a portion of the second semiconductor substrate 121 and electrically connecting the inner upper surface connection pad 122*a* to the inner lower surface connection pad 122*b*, and a second protective insulating layer 125 exposing at least a portion of the inner upper surface connection pad 122*a* and covering the active surface of the second semiconductor substrate 121. The second protective insulating layer 125 may include an inorganic material such as oxide or nitride. For example, the second protective insulating layer 125 may include at least one of silicon oxide and silicon nitride. In some embodiments, the second protective insulating layer 125 may include silicon nitride.

The second semiconductor substrate 121, the inner upper surface connection pad 122*a*, the inner lower surface connection pad 122*b*, and the second through electrode 123 may be substantially the same as the first semiconductor substrate 111, the first upper surface connection pad 112*a*, the first lower surface connection pad 112*b*, and the first through electrode 113, respectively, and thus detailed descriptions thereof are omitted in the interest of brevity.

The second semiconductor chip 120 may include, for example, a DRAM chip, an SRAM chip, a flash memory chip, an EEPROM chip, a PRAM chip, an MRAM chip, or an RRAM chip. In some embodiments, the second semiconductor chip 120 may include an HBM DRAM semiconductor chip. In some embodiments, the first semiconductor chip 110 may be referred to as a master chip, and the second semiconductor chip 120 may be referred to as a slave chip.

An inner connection terminal 124 may be attached to the inner upper surface connection pad 122*a* of each of the plurality of second semiconductor chips 120. The inner connection terminal 124 may be electrically connected between the first lower surface connection pad 112*b* of the first semiconductor chip 110 and the inner upper surface connection pad 122*a* of the second semiconductor chip 120, and between the inner lower surface connection pad 122*b* and the inner upper surface connection pad 122*a* of the second semiconductor chip 120, which are vertically adjacent to each other.

The inner connection terminal 124 may include an inner conductive pillar 124*a* on the inner upper surface connection pad 122*a* and an inner conductive cap 124*b* on the inner conductive pillar 124*a*.

A width and an area of the first semiconductor chip 110 may be greater than those of each of the plurality of second semiconductor chips 120. The first semiconductor device 100 may further include a molding layer 130 surrounding side surfaces of the plurality of second semiconductor chips 120 on the first semiconductor chip 110 and side surfaces of a second non-conductive film 135*b* to be described below. The molding layer 130 may include, for example, an epoxy mold compound (EMC).

A first non-conductive film 135*a* may be arranged between the first semiconductor chip 110 and the lowermost second semiconductor chip 120 located at the lowermost end. The first non-conductive film 135*a* may surround the inner connection terminal 124, and fill a space between the first semiconductor chip 110 and the lowermost second semiconductor chip 120 located at the lowermost end.

The first non-conductive film 135*a* may extend and protrude in the lateral direction from the side surface of the lowermost second semiconductor chip 120 at the lowermost end. The first non-conductive film 135*a* may extend to the side surface of the first semiconductor chip 110. Furthermore, the first non-conductive film 135*a* may be exposed on a side surface of the molding layer 130. A side surface of the first non-conductive film 135*a* may be coplanar with the side surface of the first semiconductor chip 110 and/or the side surface of the molding layer 130.

The second non-conductive film 135*b* may be arranged between two adjacent second semiconductor chips 120. The second non-conductive film 135*b* may fill a space between the two adjacent second semiconductor chips 120 surround the inner connection terminal 124.

The second non-conductive film 135*b* may extend and protrude from a space between the two adjacent second semiconductor chips 120 in the lateral direction. In this case, the second non-conductive film 135*b* may not be exposed to the outside of the molding layer 130.

In some embodiments, the second non-conductive film 135*b* may extend up to the side surface of the molding layer 130. In some embodiments, the second non-conductive film 135*b* may be exposed from the side surface of the molding layer 130 to the outside.

In some embodiments, among the plurality of second semiconductor chips 120, the uppermost second semiconductor chip 120 arranged at the uppermost end farthest from the first semiconductor chip 110 may not include the inner lower surface connection pad 122*b* and the second through electrode 123. In some embodiments, among the plurality of second semiconductor chips 120, a thickness of the uppermost second semiconductor chip 120 arranged at the uppermost end farthest from the first semiconductor chip 110 may be greater than thicknesses of other second semiconductor chips 120.

Referring to FIG. 2, the second semiconductor device 200 may include a third semiconductor substrate 210, the second upper surface connection pad 242, a third protective insulating layer 245, and the second connection terminal 244. The second connection terminal 244 may include the second conductive pillar 244*a* on the second upper surface connection pad 242 and a second conductive cap 244*b* on the second conductive pillar 244*a*. The third semiconductor substrate 210, the second upper surface connection pad 242, the third protective insulating layer 245, and the second connection terminal 244 may be substantially similar components to the first semiconductor substrate 111, the first upper surface connection pad 112*a*, the first protective insulating layer 115, and the first connection terminal 114, respectively, or may be substantially similar components to the second semiconductor substrate 121, the inner upper surface connection pad 122*a*, the second protective insulating layer 125, and the inner connection terminal 124, respectively, and thus detailed descriptions thereof are omitted in the interest of brevity.

The second semiconductor device 200 may include, for example, a central processing unit (CPU) chip, a graphics processing unit (GPU) chip, or an application processor (AP) chip.

The first substrate 300 may include a base layer 310, the redistribution structure 357 arranged on a first surface 312 of the base layer 310, and a plurality of pad wiring layers 324 arranged on a second surface 314 of the base layer 310. The redistribution structure 357 may include a redistribution insulating layer 357_6, and a plurality of first redistribution pads 357_2 and a plurality of second redistribution pads 357_4 respectively arranged on both surfaces of the redistribution insulating layer 357_6. Accordingly, the plurality of first redistribution pads 357_2 may be arranged on the upper surface of the first substrate 300, and the plurality of pad wiring layers 324 may be arranged on the lower surface of the first substrate 300.

The base layer 310 may include a semiconductor material, glass, ceramic, or plastic. For example, the base layer 310 may include Si. In some embodiments, the base layer 310 may include a Si semiconductor substrate. A plurality of first substrate through electrodes 330 connecting between the first surface 312 and the second surface 314 inside the base layer 310. Each of the plurality of first substrate through electrodes 330 may include a conductive plug penetrating the base layer 310 and a conductive barrier layer surrounding the conductive plug. The conductive plug may have a circular shape, and the conductive barrier layer may have a cylindrical shape surrounding a side wall of the conductive plug. A plurality of via insulating layers may be arranged between the base layer 310 and the plurality of first substrate through electrodes 330, and surround side walls of the plurality of first substrate through electrodes 330.

The redistribution structure 357 may include a redistribution insulating layer 357_6, and a plurality of first redistribution pads 357_2 and a plurality of second redistribution pads 357_4 respectively arranged on both surfaces of the redistribution insulating layer 357_6. The plurality of second redistribution pads 357_4 may be arranged on the first surface 312 of the base layer 310, and may be electrically connected to the plurality of first substrate through electrodes 330. The plurality of first substrate through electrodes 330 may be electrically connected between the plurality of second redistribution pads 357_4 and the plurality of pad wiring layers 324.

The redistribution structure 357 may further include a plurality of redistribution lines 357_7 electrically connecting the plurality of first redistribution pads 357_2 to the plurality of second redistribution pads 357_4, and a plurality of redistribution vias 357_8. In FIG. 2, the plurality of redistribution lines 357_7 are illustrated as being inside the redistribution insulating layer 357_6, but are not limited thereto.

For example, each of the plurality of first redistribution pads 357_2, the plurality of second redistribution pads 357_4, the plurality of redistribution lines 357_7, and the plurality of redistribution vias 357_8 may include copper, nickel, stainless steel, or a copper alloy such as beryllium copper. For example, the redistribution insulating layer 357_6 may include at least one of oxide, nitride, and photo imageable dielectric (PID). In some embodiments, the redistribution insulating layer 357_6 may include silicon oxide, silicon nitride, epoxy, or polyimide.

On the second surface 314 of the base layer 310, there may be a first substrate protective layer 355, the plurality of pad wiring layers 324 arranged on the first substrate protective layer 355 and connected to the plurality of first substrate through electrodes 330 penetrating the first substrate protective layer 355, a plurality of first substrate connection terminals 340 arranged on the plurality of pad wiring layers 324, and a plurality of wiring protective layers 356 surrounding the plurality of first substrate connection terminals 340 and covering the plurality of pad wiring layers 324.

The first substrate 300 may include an interposer.

A first adhesive film layer 382 may be arranged between the first semiconductor device 100 and the first substrate 300, and a second adhesive film layer 384 may be arranged between the second semiconductor device 200 and the first substrate 300. The first adhesive film layer 382 and the second adhesive film layer 384 may surround a first connection terminal 114 and the second connection terminal 244, respectively. In some embodiments, the first adhesive film layer 382 may protrude from the side surface of the first semiconductor device 100 in the lateral direction. In some embodiments, the second adhesive film layer 384 may protrude from the side surface of the second semiconductor device 200 in the lateral direction.

The second substrate 400 may include a base board layer 410, and a board upper surface pad 422 and a board lower surface pad 424 respectively arranged on an upper surface and a lower surface of the base board layer 410. In some embodiments, the second substrate 400 may include a printed circuit board. For example, the second substrate 400 may include a multi-layer printed circuit board. The base board layer 410 may include at least one material of phenol resin, epoxy resin, and polyimide.

A solder resist layer exposing the board upper surface pad 422 and the board lower surface pad 424 may be formed on the upper surface and the lower surface of the base board layer 410, respectively. The first substrate connection terminal 340 may be connected to the board upper surface pad 422, and a package connection terminal 440 may be connected to the board lower surface pad 424. The first substrate connection terminal 340 may electrically connect between the plurality of pad wiring layers 324 and the board upper surface pad 422. The package connection terminal 440 connected to the board lower surface pad 424 may connect the semiconductor package 1 to an external device.

The package connection terminal 440 may have greater dimensions (for example, a diameter) than the plurality of first connection terminals 114, the plurality of second connection terminals 244, and the first substrate connection terminal 340. In addition, the first substrate connection terminal 340 may have greater dimensions (for example, a diameter) than the plurality of first connection terminals 114 and the plurality of second connection terminals 244.

A board adhesive film layer 380 may be arranged between the first substrate 300 and the second substrate 400. The board adhesive film layer 380 may surround the plurality of first substrate connection terminals 340.

In some embodiments, one or more of the first adhesive film layer 382, the second adhesive film layer 384, and the board adhesive film layer 380 may include the silica filler 137 described above with reference to FIG. 1. In some embodiments, one or more of the first adhesive film layer 382, the second adhesive film layer 384, and the board adhesive film layer 380 may include the adhesive sheet 10 described above with reference to FIG. 1.

The adhesive sheet 10 described above with reference to FIG. 1 may have a convex surface toward the outside when the semiconductor package 1 is applied as one or more of the first adhesive film layer 382, the second adhesive film layer 384, and the board adhesive film layer 380.

FIG. 2 illustrates an example in which the adhesive sheet 10 is applied to each of the first adhesive film layer 382, the second adhesive film layer 384, and/or the board adhesive film layer 380. Each of the first adhesive film layer 382, the second adhesive film layer 384, and/or the board adhesive film layer 380 may have a convex side surface toward the outside.

In some embodiments, the first adhesive film layer 382, the second adhesive film layer 384, and the board adhesive film layer 380, to which the adhesive sheet 10 is applied, may be generally optically transparent. In some embodiments, an optical transmittance of the first adhesive film layer 382, the second adhesive film layer 384, and the board adhesive film layer 380, to which the adhesive sheet 10 is applied, may be about 30% or more with respect to light having a wavelength of about 400 nm to about 700 nm. Because, in general, with respect to light having a wavelength range of visible light of about 400 nm to about 700 nm, the first adhesive film layer 382, the second adhesive film layer 384, and the board adhesive film layer 380 have sufficient transmittance, alignment marks provided on each of upper surfaces of the first semiconductor device 100, the second semiconductor device 200, and the first substrate 300 may be visibly identifiable, and may be aligned better when the semiconductor package 1 is manufactured.

The semiconductor package 1 may further include a package molding layer 800 surrounding side surfaces of the first semiconductor device 100 and the second semiconductor device 200, on the first substrate 300. The package molding layer 800 may include, for example, EMC.

In some embodiments, the package molding layer 800 may cover an upper surface of the first substrate 300 and the side surfaces of each of the first semiconductor device 100 and the second semiconductor device 200, but may not cover the upper surfaces of the first semiconductor device 100 and the second semiconductor device 200. In this case, the semiconductor package 1 may further include a heat dissipating member 950 covering the upper surfaces of the first semiconductor device 100 and the second semiconductor device 200. The heat dissipating member 950 may include a heat dissipating plate such as a heat slug or a heat sink. In some embodiments, the heat dissipating member 950 may surround the upper surfaces and side surfaces of the first semiconductor device 100, the second semiconductor device 200, and the first substrate 300, on the upper surface of the second substrate 400. In some embodiments, the heat dissipating member 950 may include a flat plate or a solid of a metal material.

In some embodiments, the heat dissipating member 950 may block an electronic wave and dissipate heat, and may be connected to the board upper surface pad 422 including ground, of the plurality of board upper surface pads 422 of the second substrate 400.

The semiconductor package 1 may include a thermal interface material (TIM) 900 arranged between the heat dissipating member 950, and the first semiconductor device 100 and the second semiconductor device 200. The TIM 900 may include paste, a film, etc.

FIGS. 4A through 4G are schematic side cross-sectional views illustrating a manufacturing method of a semiconductor package, according to embodiments.

Figure 4A:
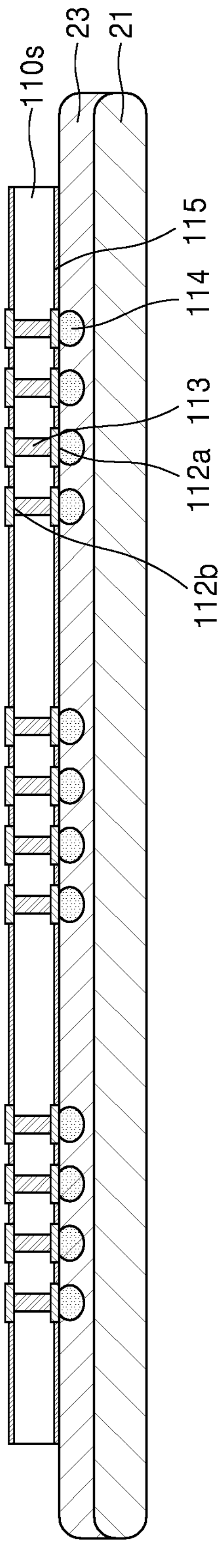
FIGS. 4A through 4G are schematic side cross-sectional views illustrating a manufacturing method of a semiconductor package, according to embodiments.

Referring to FIG. 4A, a semiconductor substrate 110*s* may be attached to a carrier substrate 21.

The carrier substrate 21 may include, for example, Si (for example, a blank device wafer), soda lime glass, borosilicate glass, silicon carbide, silicon germanium, silicon nitride, gallium arsenic, sapphire, various metals, and ceramics. However, the inventive concept is not limited thereto.

The semiconductor substrate 110*s* may include a semiconductor such as Si and Ge, or a compound semiconductor such as SiGe, SiC, GaAs, InAs, and InP, and an active surface, on which a semiconductor element is formed, may be arranged to face the carrier substrate 21.

The semiconductor substrate 110*s* may be attached to the carrier substrate 21 by using a binder 23. The binder 23 may include a general adhesive including a polysiloxane compound, and may combine the carrier substrate 21 with the semiconductor substrate 110*s* at a sufficient strength.

Figure 4B:
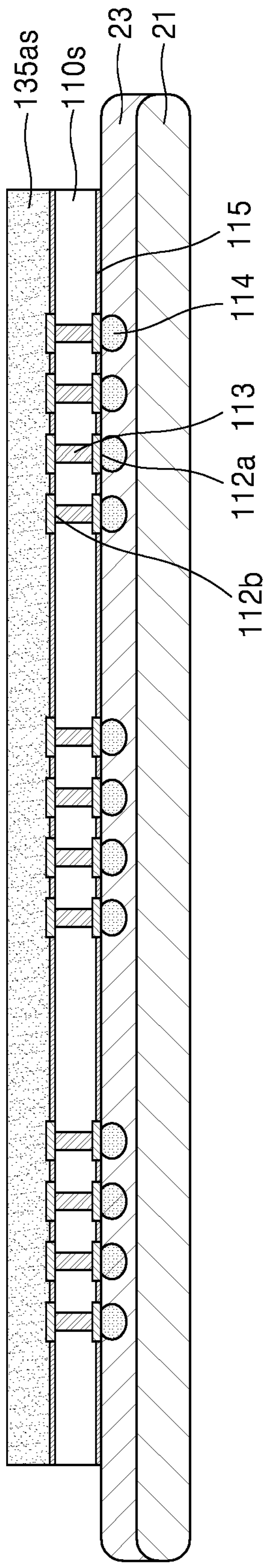

Referring to FIG. 4B, a first adhesive sheet 135*as* having substantially the same size (for example, a plan area) as the semiconductor substrate 110*s* on the semiconductor substrate 110*s* may be provided. The first adhesive sheet 135*as* may be manufactured by using the adhesive sheet 10 described above with reference to FIG. 1. Because the first adhesive sheet 135*as* has adhesion, the first adhesive sheet 135*as* may be attached to the semiconductor substrate 110*s*. In addition, because the first adhesive sheet 135*as* is in a state or status of not being fully cured, the first adhesive sheet 135*as* may be in a state or status in which the first adhesive sheet 135*as* is somewhat deformable due to an external force.

For adhesion, the first adhesive sheet 135*as* may be heated to a temperature of about 170° C. to about 300° C. for about 1 second to about 10 seconds. The heating temperature and the heating time may be determined by considering an amount of thermal energy transferred to the first adhesive sheet 135*as*. When excessive thermal energy is applied to the first adhesive sheet 135*as*, due to an excessive cure, it may be difficult to proceed with subsequent processes.

Figure 4C:
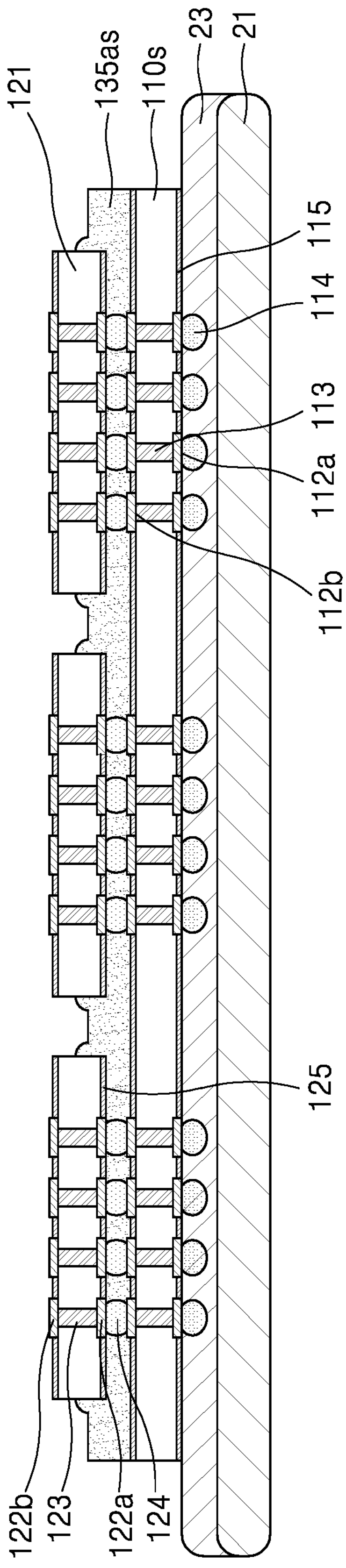

Referring to FIG. 4C, the plurality of second semiconductor substrates 121 may be stacked on the semiconductor substrate 110*s*. The inner connection terminal 124 provided to the second semiconductor substrates 121 may penetrate the first adhesive sheet 135*as* and contact the first lower surface connection pad 112*b*.

Figure 4D:
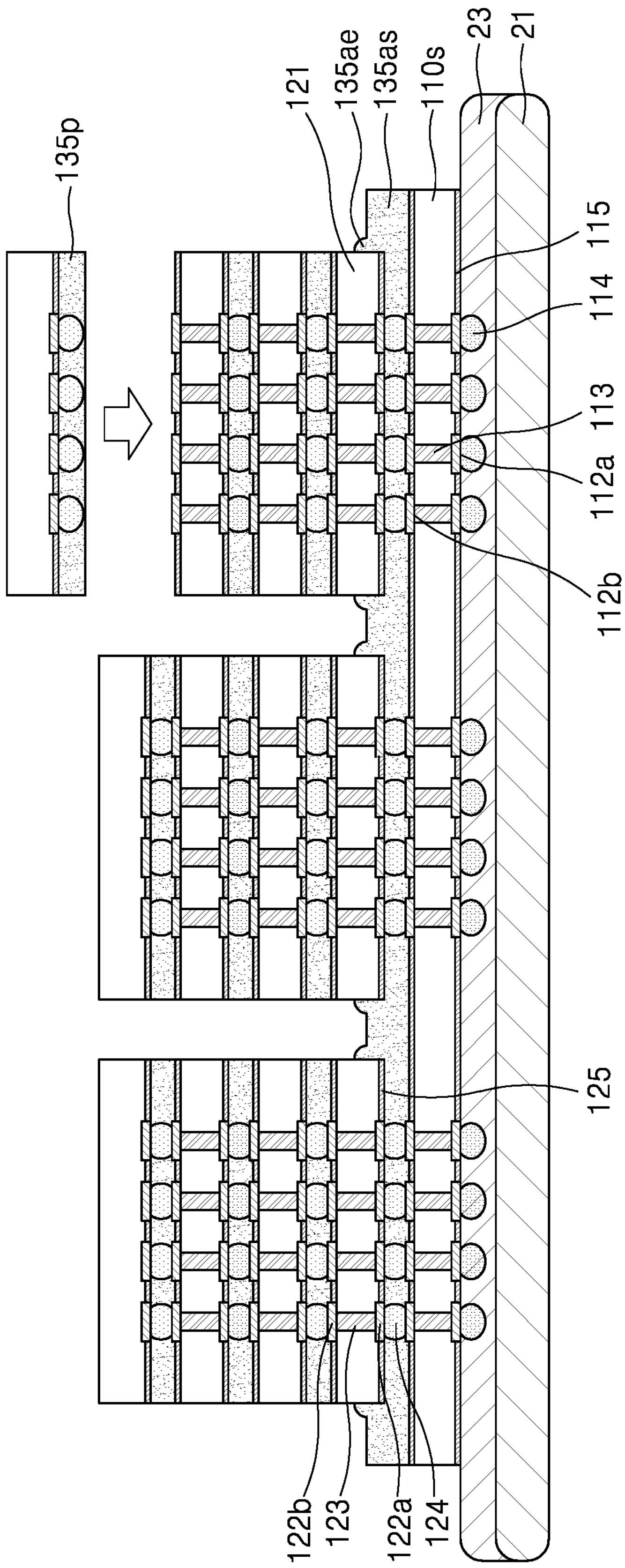

Referring to FIG. 4D, the plurality of second semiconductor substrates 121, to which a second adhesive sheet 135*p* is added, may be additionally stacked. In this case, a plan area of the second adhesive sheet 135*p* may be substantially the same as that of the second semiconductor substrate 121. The second adhesive sheet 135*p* may be manufactured by using the adhesive sheet 10 described above with reference to FIG. 1.

In FIG. 4D, it is illustrated that four second semiconductor substrates 121 are stacked, but it should be readily understood by one of ordinary skill in the art that more or less than four of the second semiconductor substrates 121 may be stacked.

For adhesion, the second adhesive sheet 135*p* may be heated to a temperature of about 170° C. to about 300° C. for about 1 second to about 20 seconds.

Figure 4E:
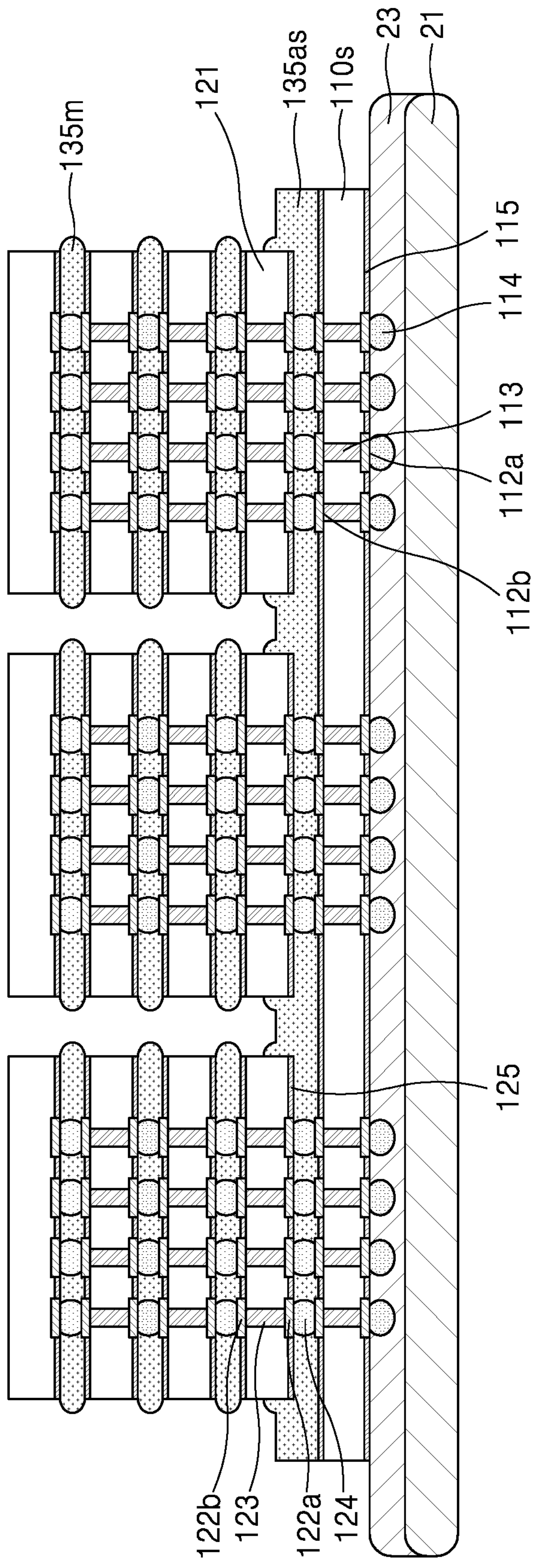

Referring to FIG. 4E, the first adhesive sheet 135*as* and the second adhesive sheet 135*p* may be cured. The curing may be performed at a temperature of about 130° C. to about 210° C. for about 30 minutes to about 3 hours. The curing temperature may be somewhat lower than a temperature for attaching the first and second adhesive sheets 135*as* and 135*p*. A curing time may be longer than a heating time for attaching the first and second adhesive sheets 135*as* and 135*p*.

While the curing is performed by a cross-linking agent in the first and second adhesive sheets 135*as* and 135*p*, the second adhesive sheet 135*p* may be somewhat reflowed due to heating, and may protrude to the outside of the side surfaces of the second semiconductor substrates 121.

In some embodiments, the curing operation may be omitted. In the attachment operation described with reference to FIGS. 4C and 4D, the first and second adhesive sheets 135*as* and 135*p* may also be cured, and in this case, a separate curing operation may be unnecessary.

Figure 4F:
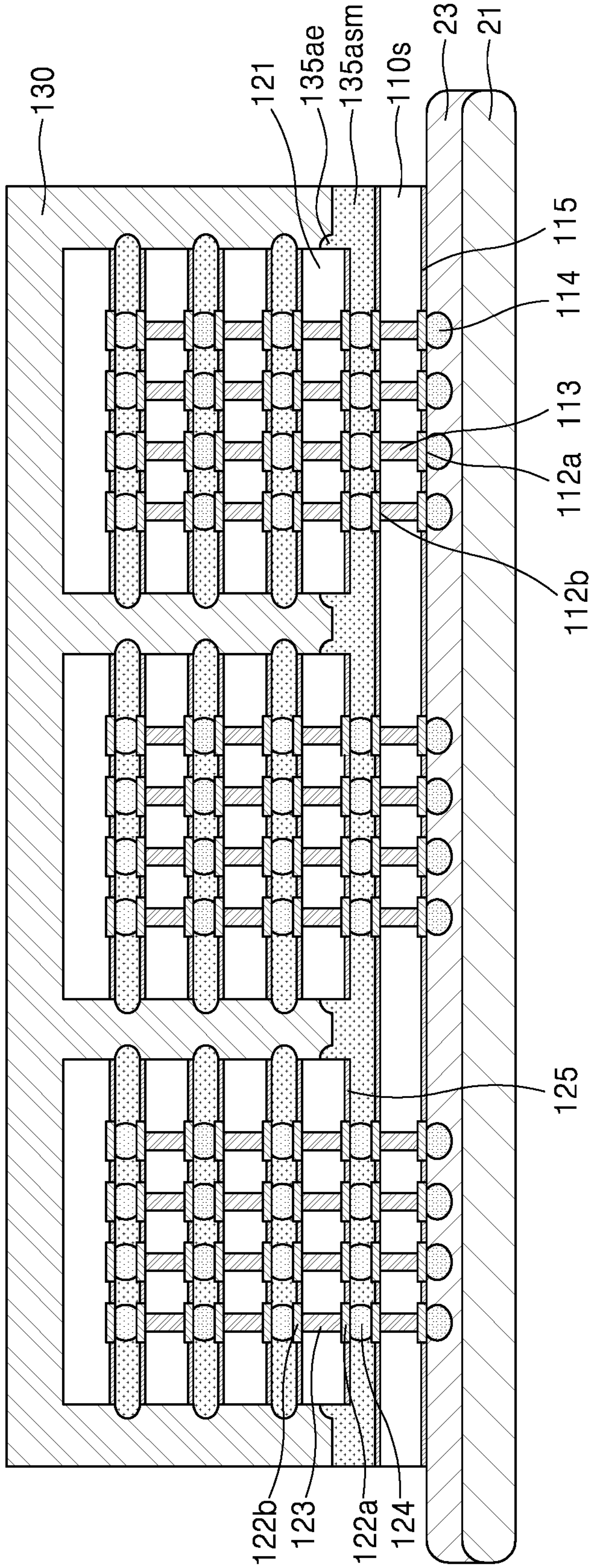

Referring to FIG. 4F, the molding layer 130 may be formed to surround the side surfaces and the upper surface of the plurality of second semiconductor substrates 121. In some embodiments, the molding layer 130 may surround only the side surfaces and expose the upper surface of the plurality of second semiconductor substrates 121. The molding layer 130 may be formed by using an epoxy molding compound material.

Figure 4G:
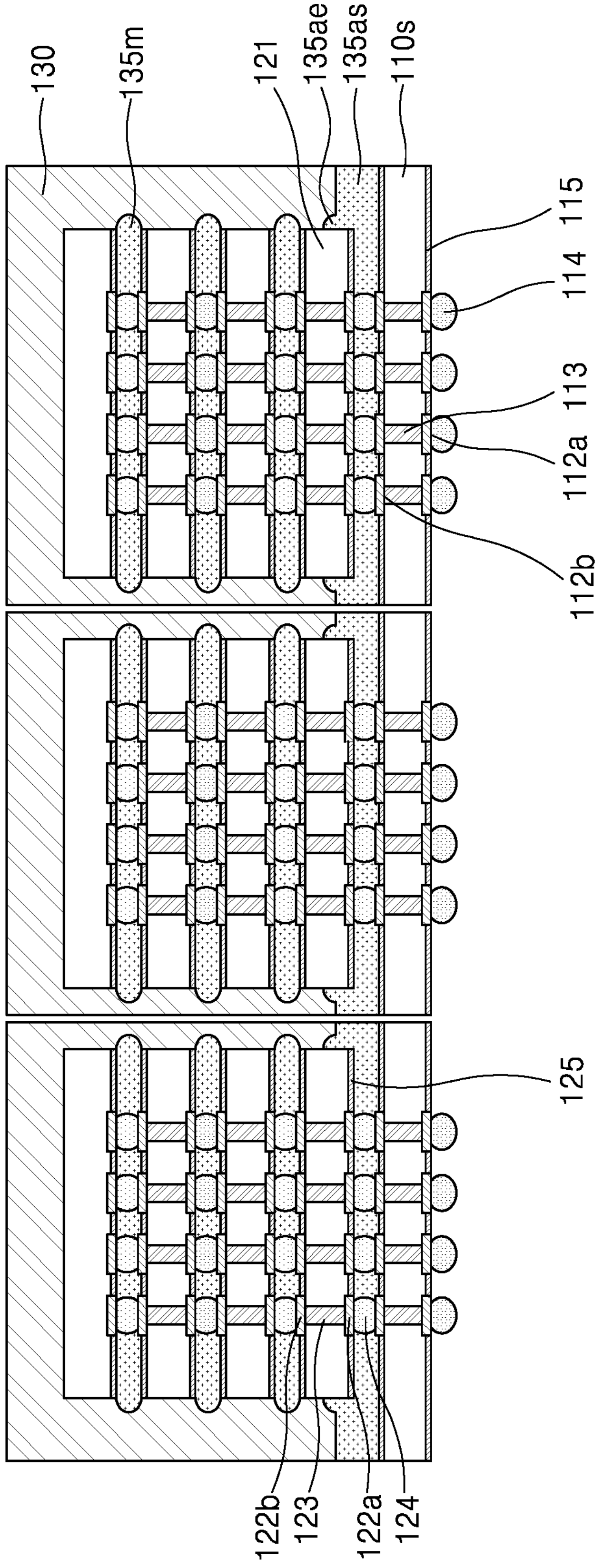

Referring to FIG. 4G, after the carrier substrate 21 is removed, semiconductor packages may be individually singulated.

Removal of the carrier substrate 21 may be performed by applying an external force to generate cracks in a surface of the binder 23. For example, the removal may be performed by applying an impact by using a blade or an initiator to generate cracks in the surface of the binder 23. Once a crack is generated, the crack may propagate and the carrier substrate 21 may be removed.

The singulation may be performed by using a saw, but is not limited thereto.

Figure 5:
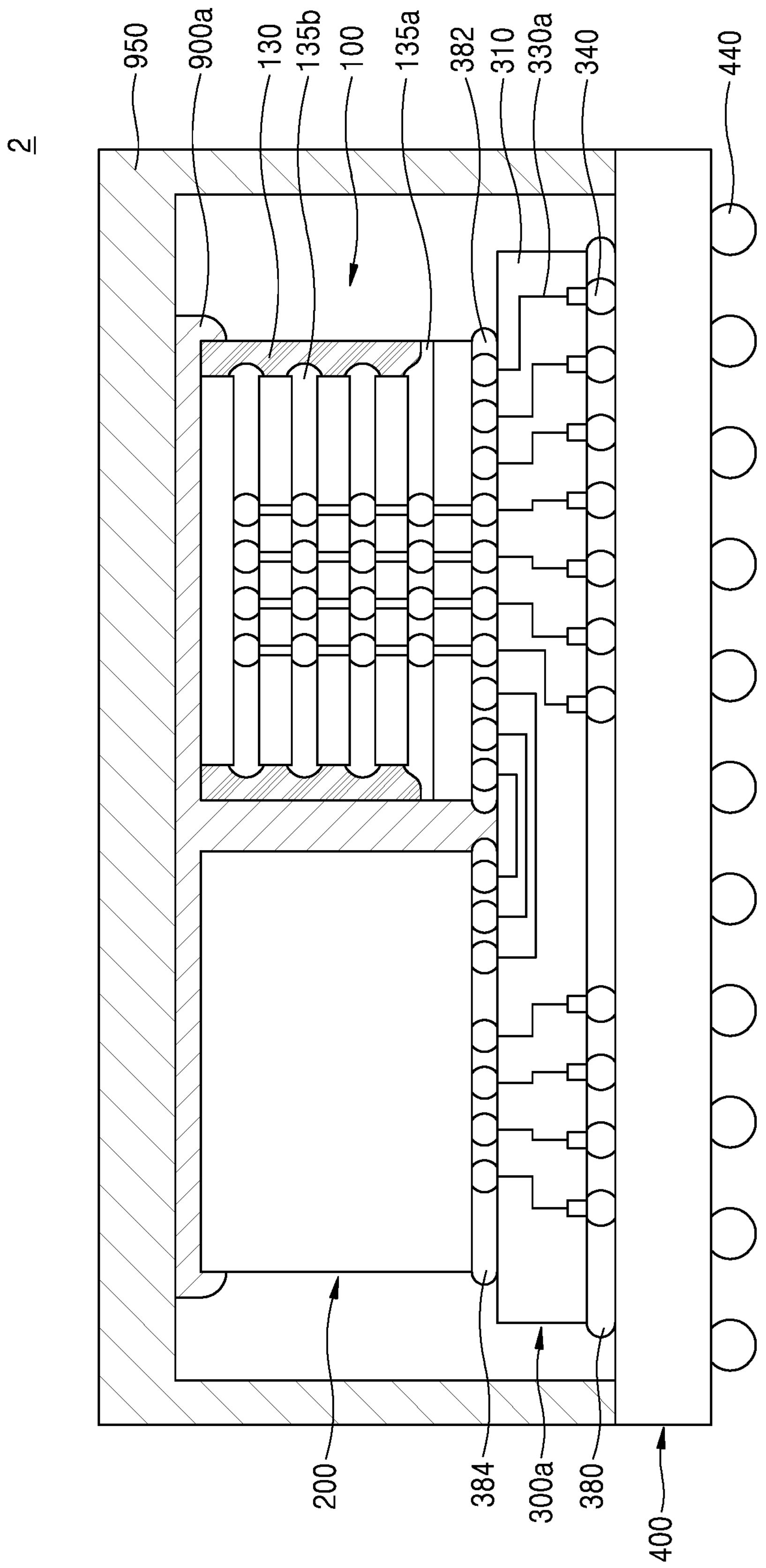
FIGS. 5 through 10 are cross-sectional views of a semiconductor package, according to different embodiments.

FIG. 5 is a cross-sectional view of a semiconductor package 2, according to another embodiment. The semiconductor package 2 in FIG. 5 may be slightly different in a configuration of a first substrate 300*a* and a TIM 900*a*, compared to the semiconductor package 1 illustrated in FIGS. 2 and 3. Thus, descriptions below are given based on these differences.

Referring to FIG. 5, connection wirings 330*a* may be provided, instead of through electrodes, inside the first substrate 300*a*. The first semiconductor device 100 and the second semiconductor device 200 may be connected to each other via the connection wiring 330*a*, or may be electrically connected to the second substrate 400 via the first substrate connection terminal 340. The connection wiring 330*a* may partially include a through silicon via (TSV).

In some embodiments, the second semiconductor device 200 may include a logic semiconductor device, and may include, for example, an application-specific integrated circuit (ASIC) such as a CPU, a GPU, and a system on chip (SoC).

The TIM 900*a* may extend in a horizontal direction from an upper portion of the first semiconductor device 100 to an upper portion of the second semiconductor device 200. In addition, the TIM 900*a* may at least partially bury or fill a space between the first semiconductor device 100 and the second semiconductor device 200.

The first semiconductor device 100 has been described with reference to FIG. 3, and thus, additional description thereof is omitted in the interest of brevity.

Figure 6:
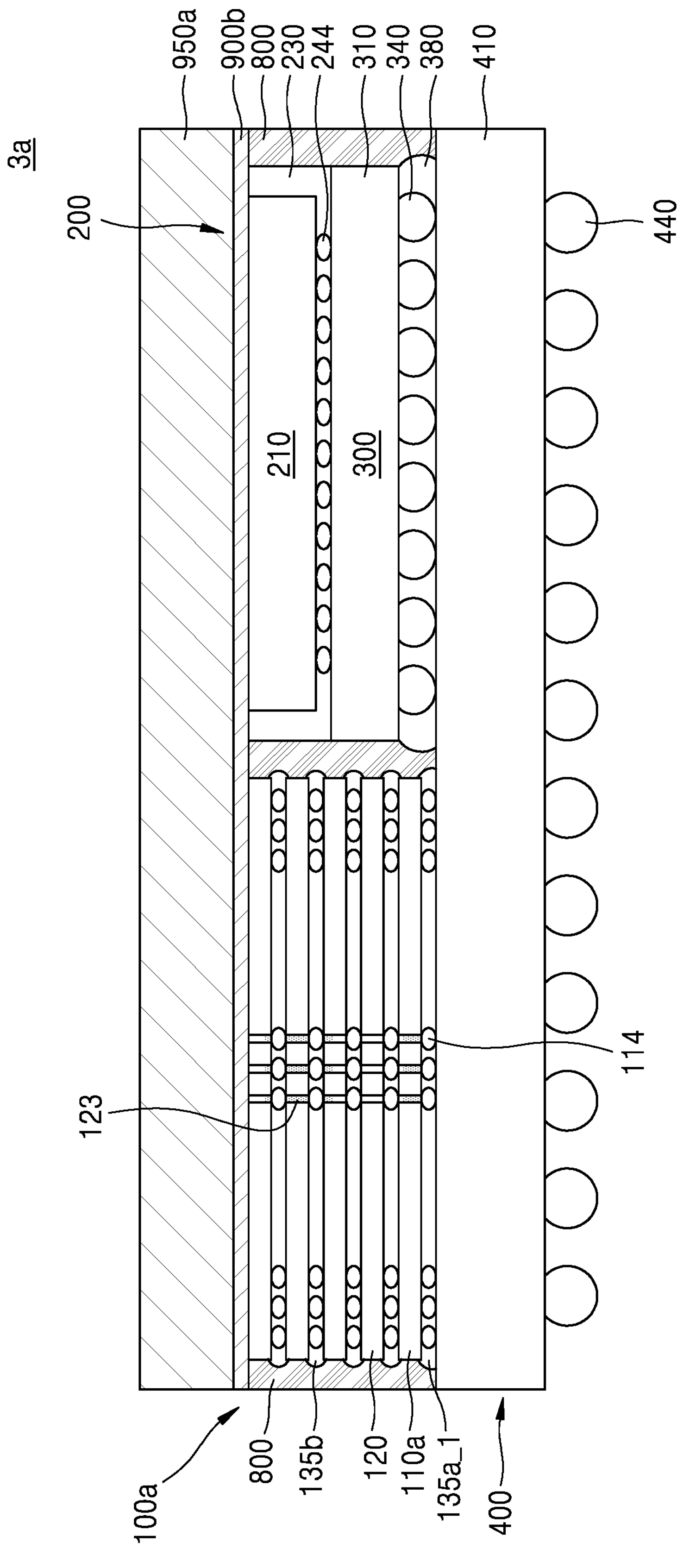

FIG. 6 is a cross-sectional view of a semiconductor package 3*a*, according to an embodiment.

Referring to FIG. 6, in the semiconductor package 3*a*, the second semiconductor device 200 may be mounted on the first substrate 300, and the first substrate 300 may be mounted on the second substrate 400. In addition, a first semiconductor device 100*a* may be mounted directly on the second substrate 400.

Side surfaces of the second semiconductor device 200 may be sealed by a molding layer 230. The molding layer 230 may include, for example, EMC. In this case, an upper surface of the second semiconductor device 200 may be exposed from the molding layer 230. The molding layer 230 may fill a space between the second semiconductor device 200 and the first substrate 300.

In some embodiments, upper surfaces of the first semiconductor device 100*a* and the second semiconductor device 200 may directly contact a TIM 900*b*.

A heat dissipating member 950*a* may be provided on the upper portion of the TIM 900*b*. The heat dissipating member 950*a* may include, for example, a heat sink, a heat spreader, a heat pipe, or a liquid cooled cold plate.

The plurality of second semiconductor chips 120 may be attached to each other by the second non-conductive film 135*b*. In addition, a first or lowermost semiconductor chip 110*a* may be attached to the second substrate 400 by using a first non-conductive film 135*a*_1. In some embodiments, the first non-conductive film 135*a*_1 may be substantially the same as the second non-conductive film 135*b*. In some embodiments, the first non-conductive film 135*a*_1 and/or the second non-conductive film 135*b* may be manufactured by using the adhesive sheet 10 described with reference to FIG. 1.

In addition, the second semiconductor device 200 may be attached to the second substrate 400 by using a board film layer 380, to which the adhesive sheet 10 described with reference to FIG. 1 is applied.

In the semiconductor package 3*a*, the first substrate 300, on which the second semiconductor device 200 is mounted, and the first semiconductor device 100*a* may be arranged adjacent to each other on the second substrate 400, and the TIM 900*b* and the heat dissipating member 950*a* may be attached and formed on the second semiconductor device 200 and the first semiconductor device 100*a*.

The second through electrode 123 formed in the second semiconductor chips 120 at the uppermost end of the plurality of second semiconductor chips 120 stacked in the first semiconductor device 100*a* may contact the TIM 900*b*. The TIM 900*b* may be electrically non-conductive. When the heat dissipating member 950*a* is electrically conductive, the second through electrode 123 may be electrically insulated from the heat dissipating member 950*a* by the TIM 900*b*.

Figure 7:
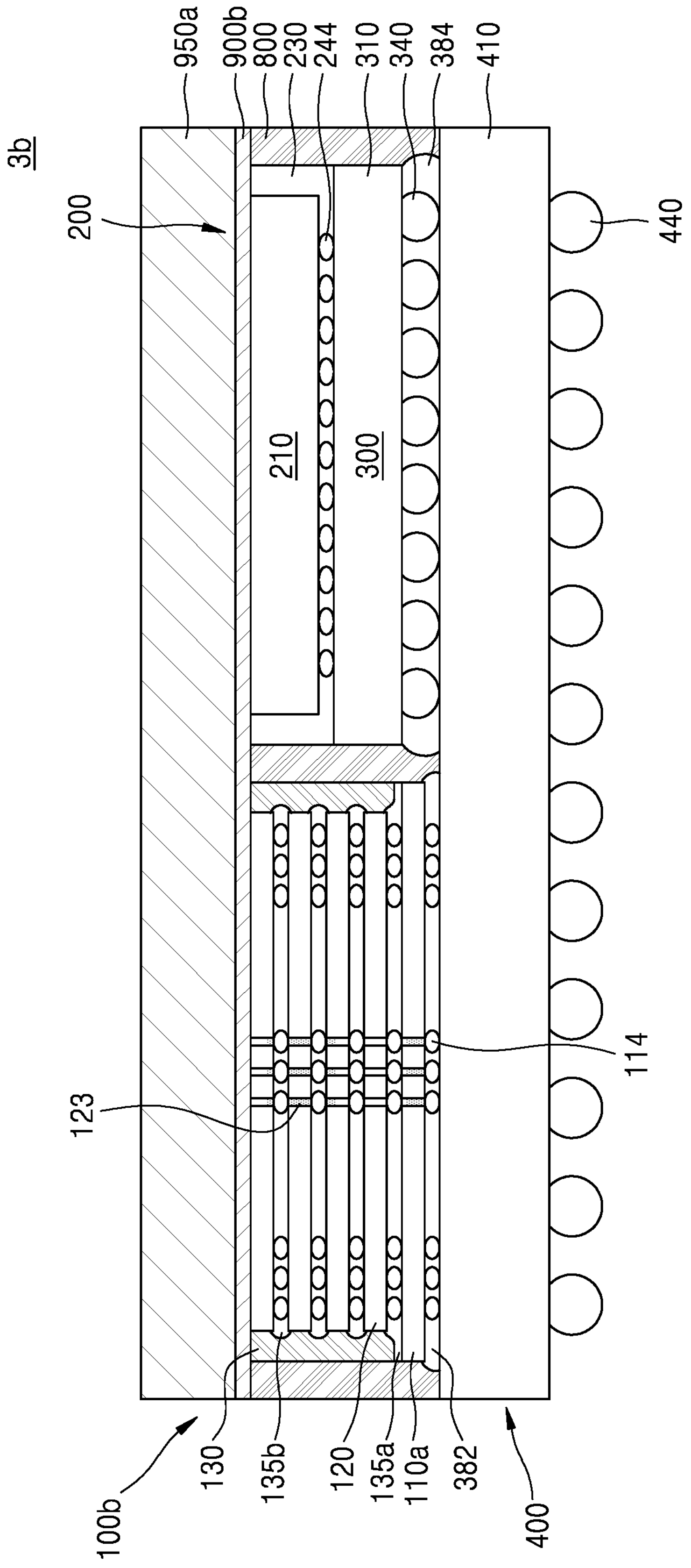

FIG. 7 is a cross-sectional view of a semiconductor package 3*b*, according to an embodiment.

Referring to FIG. 7, in the semiconductor package 3*b*, the second semiconductor device 200 may be mounted on the first substrate 300, and the first substrate 300 may be mounted on the second substrate 400. In addition, a first semiconductor device 100*b* may be directly mounted on the second substrate 400.

The first semiconductor device 100*b* may further include the molding layer 130. The molding layer 130 may be configured to surround the side surfaces of the plurality of second semiconductor chips 120, which are stacked as described with reference to FIG. 3, but may be configured not to cover the upper surface of the second semiconductor chip 120 at the uppermost end.

The first adhesive film layer 382 may be formed to fill a space between the first semiconductor device 100*b* and the second substrate 400. The first adhesive film layer 382 may include the adhesive sheet 10 described with reference to FIG. 1. In some embodiments, the first adhesive film layer 382 may be, for example, a portion of the package molding layer 800.

The second adhesive film layer 384 may be formed to fill a space between the second semiconductor device 200 and the second substrate 400. The second adhesive film layer 384 may include the adhesive sheet 10 described with reference to FIG. 1. In some embodiments, the second adhesive film layer 384 may be, for example, a portion of the package molding layer 800.

In the semiconductor package 3*b*, the first substrate 300, on which the second semiconductor device 200 is mounted, and the first semiconductor device 100*b* may be arranged adjacent to each other on the second substrate 400, and the TIM 900*b* and the heat dissipating member 950*a* may be attached and formed on the second semiconductor device 200 and the first semiconductor device 100*b*.

Figure 8:
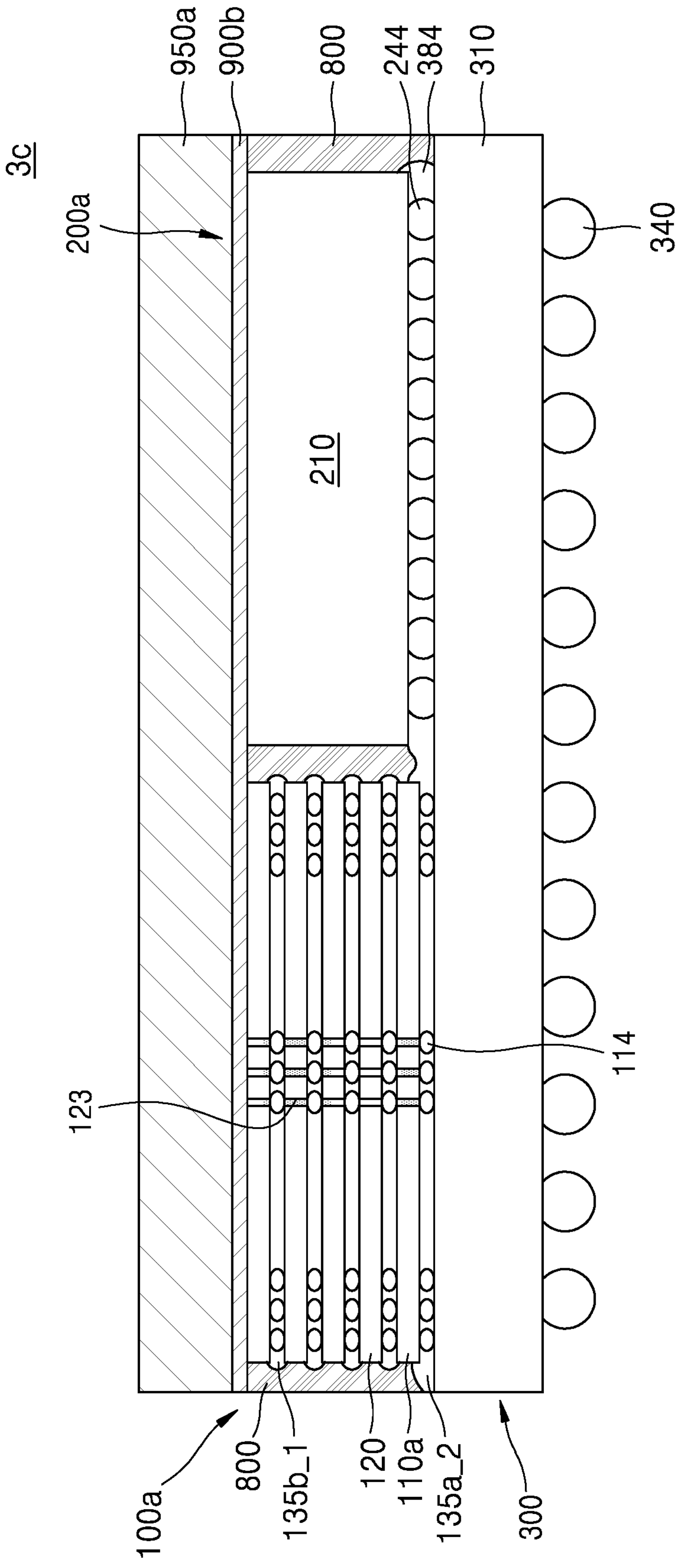

FIG. 8 is a cross-sectional view of a semiconductor package 3*c*, according to an embodiment.

Referring to FIG. 8, in the semiconductor package 3*c*, the first semiconductor device 100*a* and a second semiconductor device 200*a* may be mounted directly on the first substrate 300. The first semiconductor device 100*a* and the second semiconductor device 200*a* may be arranged adjacent to each other in the lateral direction.

The plurality of second semiconductor chips 120 may be attached to each other by the second adhesive sheet 135*b*_1. In addition, the first or lowermost semiconductor chip 110*a* may be attached to the first substrate 300 by using a first adhesive sheet 135*a*_2. In some embodiments, the first adhesive sheet 135*a*_2 may be substantially the same as the second adhesive sheet 135*b*_1. In some embodiments, the first adhesive sheet 135*a*_2 and/or the second adhesive sheet 135*b*_1 may be manufactured by using the adhesive sheet 10 described with reference to FIG. 1.

The second semiconductor device 200*a* may be attached to the first substrate 300 so that an active surface thereof faces the first substrate 300. The second semiconductor device 200*a* may be electrically connected to the first substrate 300 via the second connection terminal 244 arranged on the active surface the second semiconductor device 200. The second adhesive film layer 384 may be provided to fill a space between the second semiconductor device 200*a* and the first substrate 300. In some embodiments, the second semiconductor device 200*a* may include a wafer level package (WLP).

In some embodiments, the first adhesive sheet 135*a*_2 may be connected to the second adhesive film layer 384. There may be an interface between the first adhesive sheet 135*a*_2 and the second adhesive film layer 384.

Figure 9:
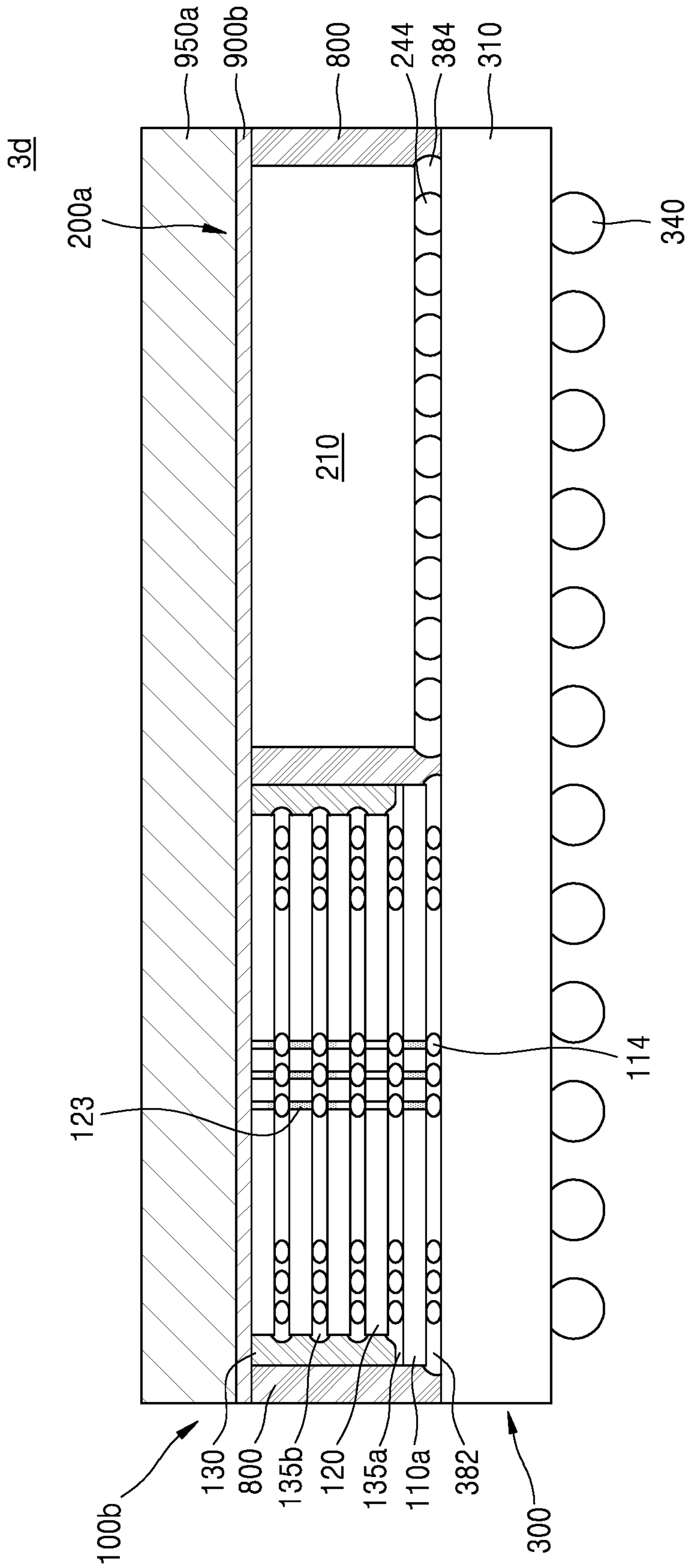

FIG. 9 is a cross-sectional view of a semiconductor package 3*d*, according to an embodiment.

Referring to FIG. 9, in the semiconductor package 3*d*, the first semiconductor device 100*b* and the second semiconductor device 200*a* may be mounted directly on the first substrate 300. The first semiconductor device 100*b* and the second semiconductor device 200*a* may be arranged adjacent to each other in the lateral direction.

The first semiconductor device 100*b* may further include the molding layer 130. The molding layer 130 may be configured to surround the side surfaces of the plurality of second semiconductor chips 120, which are stacked as described with reference to FIG. 3, but may be configured not to cover the upper surface of the second semiconductor chip 120 at the uppermost end. The first semiconductor device 100*b* has been described with reference to FIG. 3, and detailed description thereof is omitted in the interest of brevity.

The second adhesive film layer 384 may be formed to fill a space between the second semiconductor device 200*a* and the first substrate 300. The second adhesive film layer 384 may include the adhesive sheet 10 described with reference to FIG. 1. In some embodiments, the second adhesive film layer 384 may be, for example, a portion of the package molding layer 800.

In some embodiments, the upper surfaces of the first semiconductor device 100*b* and the second semiconductor device 200*a* may directly contact the TIM 900*b*.

Figure 10:
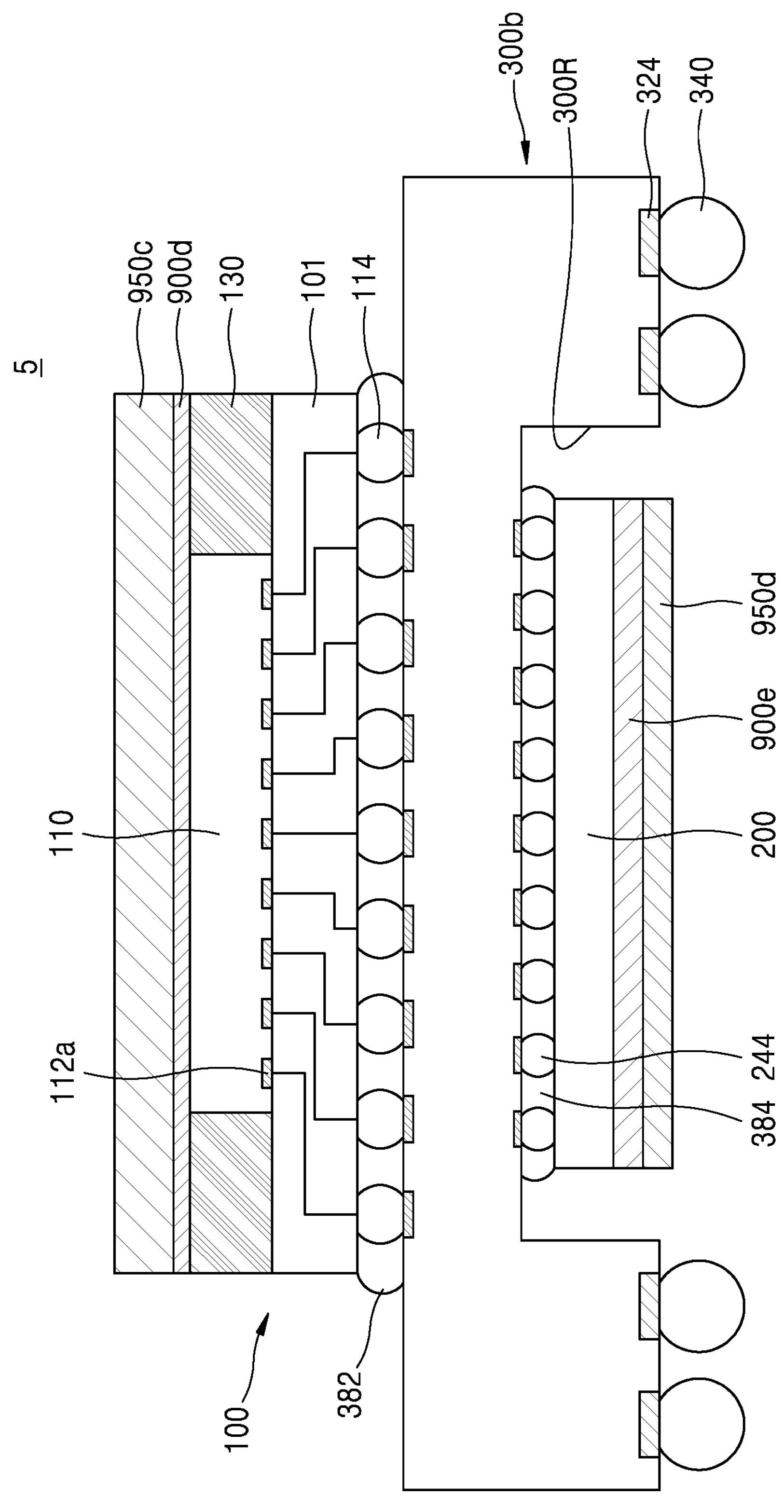

FIG. 10 is a side cross-sectional view of a semiconductor package 5, according to another embodiment.

Referring to FIG. 10, the first semiconductor device 100 and the second semiconductor device 200 may be respectively mounted on two different surfaces of a first substrate 300*b*.

The first semiconductor device 100 may be provided on one side surface of the first substrate 300*b*. The first semiconductor device 100 may include the first semiconductor chip 110 and a fan-out layer 101 provided on the active surface of the first semiconductor chip 110. The fan-out layer 101 may include a fan-out redistribution layer or an interposer.

The first semiconductor device 100 may be electrically connected to the first substrate 300*b* via the first connection terminal 114. In addition, the first adhesive film layer 382 may be provided to fill a space between the first semiconductor device 100 and the first substrate 300*b*. The first adhesive film layer 382 may include the adhesive sheet 10 described with reference to FIG. 1.

The side surface of the first semiconductor chip 110 may be sealed by the molding layer 130. The molding layer 130 may include, for example, EMC. The upper surface of the first semiconductor device 100 may directly contact a first TIM 900*d*.

A first heat dissipating member 950*c* may be provided on the upper portion of the first TIM 900*d*. The first heat dissipating member 950*c* may include, for example, a heat sink, a heat spreader, a heat pipe, or a liquid cooled cold plate.

The first substrate 300*b* may include a recess portion 300R on the other side surface thereof. The second semiconductor device 200 may be provided in the recess portion 300R. The second semiconductor device 200 may be electrically connected to the first substrate 300*b* via the second connection terminal 244 arranged on the active surface of the second semiconductor device 200. In addition, the second adhesive film layer 384 may fill a space between the second semiconductor device 200 and the first substrate 300*b*. The second adhesive film layer 384 may include the adhesive sheet 10 described with reference to FIG. 1.

The lower surface of the second semiconductor device 200 may directly contact a second TIM 900*e*. In addition, a second heat dissipating member 950*d* may be provided on an upper surface of the second TIM 900*e*. In FIG. 10, the second heat dissipating member 950*d* is illustrated in a flat shape, but the second heat dissipating member 950*d* may extend vertically to the side surface of the second semiconductor device 200. Furthermore, the second heat dissipating member 950*d* may be electrically connected to a ground terminal of the first substrate 300*b*.

While the inventive concept has been particularly shown and described with reference to embodiments thereof, it will be understood that various changes in form and details may be made therein without departing from the scope of the following claims.

What is claimed is:

1. A semiconductor package comprising:

a first substrate;

a second substrate comprising a semiconductor element formed thereon;

an adhesive film layer between the first substrate and the second substrate; and a molding member surrounding the second substrate, wherein the adhesive film layer comprises a crystalline spherical silica filler distributed in a matrix, wherein an average dimension of the crystalline spherical silica filler is greater than 25 μm and equal to or less than 100 μm, wherein a thermal conductivity of the crystalline spherical silica filler is about 5.5 W/(m·K) to about 30 W/(m·K), and wherein the crystalline spherical silica filler comprises cristobalite.

2. The semiconductor package of claim 1, wherein a content of the crystalline spherical silica filler in the adhesive film layer is about 1 weight % to about 90 weight %.

3. The semiconductor package of claim 1, wherein the adhesive film layer, between the first substrate and the second substrate, has a sidewall protruding outward.

4. The semiconductor package of claim 1, wherein a refractive index of the crystalline spherical silica filler is about 1.65 or less.

5. The semiconductor package of claim 1, wherein a sphericity of the crystalline spherical silica filler is about 0.8 to about 1.

6. The semiconductor package of claim 1, wherein an overall thermal conductivity of the adhesive film layer is about 1 W/(m·K) to about 5 W/(m·K).

7. A semiconductor package comprising:

a package substrate;

an interposer substrate on the package substrate;

a first semiconductor device on the interposer substrate and comprising a plurality of stacked semiconductor chips;

a second semiconductor device adjacent the first semiconductor device and on the interposer substrate; and a molding member surrounding at least side surfaces of the plurality of stacked semiconductor chips, wherein the first semiconductor device further comprises an adhesive film layer between adjacent ones of the plurality of stacked semiconductor chips, wherein the adhesive film layer comprises a matrix and a crystalline silica filler dispersed in the matrix, and a content of the crystalline silica filler is about 30 weight % to about 90 weight % with respect to a weight of the adhesive film layer, and wherein a side surface of the adhesive film layer on a lowermost one of the plurality of stacked semiconductor chips is coplanar with a side surface of the lowermost one of the plurality of stacked semiconductor chips and a side surface of the molding member.

8. The semiconductor package of claim 7, wherein the matrix comprises at least one of epoxy-based polymer, acryl-based polymer, bismaleimide-based polymer, and phenoxy-based polymer.

9. The semiconductor package of claim 7, wherein a thickness of the adhesive film layer is about 5 μm to about 40 μm.

10. The semiconductor package of claim 7, wherein a percentage of a weight of the crystalline silica filler having a dimension of 100 μm or less over a total weight of the crystalline silica filler in the adhesive film layer is about 90 weight % or more.

11. The semiconductor package of claim 7, wherein a transmittance of the adhesive film layer is about 30% or more with respect to light having a wavelength of about 400 nm to about 700 nm.

12. The semiconductor package of claim 11, wherein an overall thermal conductivity of the adhesive film layer is about 1 W/(m·K) to about 5 W/(m·K).

13. The semiconductor package of claim 11, wherein a sphericity of the crystalline silica filler is about 0.8 or more, and wherein the sphericity is a ratio (B/A) of a surface area (B) of a sphere having an identical volume to the crystalline silica filler over a surface area (A) of the crystalline silica filler.

14. The semiconductor package of claim 7, further comprising a heat dissipating member on the first semiconductor device and the second semiconductor device.

15. The semiconductor package of claim 7, wherein a thermal conductivity of the crystalline silica filler is about 5.5 W/(m·K) to about 30 W/(m·K).

16. The semiconductor package of claim 7, wherein an average dimension of the crystalline silica filler is greater than 25 μm and equal to or less than 100 μm.

17. A semiconductor package comprising:

a first substrate;

a second substrate comprising a semiconductor element formed thereon;

an adhesive film layer between the first substrate and the second substrate; and a molding member surrounding the second substrate, wherein the adhesive film layer comprises a crystalline spherical silica filler distributed in a matrix, wherein a thermal conductivity of the crystalline spherical silica filler is about 5.5 W/(m·K) to about 30 W/(m·K), and wherein a side surface of the adhesive film layer is coplanar with a side surface of the first substrate and a side surface of the molding member.

* * * * *